United States Patent
Ozawa et al.

(10) Patent No.: US 9,312,327 B2
(45) Date of Patent: Apr. 12, 2016

(54) SEMICONDUCTOR DEVICE

(71) Applicant: RENESAS ELECTRONICS CORPORATION, Kanagawa (JP)

(72) Inventors: Ken Ozawa, Kanagawa (JP); Hiroyuki Kunishima, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/747,891

(22) Filed: Jun. 23, 2015

(65) Prior Publication Data

US 2015/0380480 A1 Dec. 31, 2015

(30) Foreign Application Priority Data

Jun. 25, 2014 (JP) .................................. 2014-130052

(51) Int. Cl.
*H01L 27/108* (2006.01)
*H01L 29/94* (2006.01)
*H01L 49/02* (2006.01)
*H01L 27/06* (2006.01)
*H01L 23/522* (2006.01)

(52) U.S. Cl.
CPC ............ *H01L 28/60* (2013.01); *H01L 23/5226* (2013.01); *H01L 27/0629* (2013.01); *H01L 27/10814* (2013.01)

(58) Field of Classification Search
CPC . H01L 28/60; H01L 23/5226; H01L 27/0629; H01L 27/10814
See application file for complete search history.

(56) References Cited

U.S. PATENT DOCUMENTS 6,255,151 B1 7/2001 Fukuda et al.
8,258,039 B2 * 9/2012 Inoue .................... H01L 27/105 257/296
8,624,328 B2 * 1/2014 Kawahara ............. H01L 23/522 257/379
8,946,800 B2 * 2/2015 Kume ............... H01L 27/10808 257/296
2008/0128859 A1 * 6/2008 Chen .................... H01L 23/5223 257/534
2013/0092993 A1 4/2013 Hijioka et al.
2013/0278568 A1 * 10/2013 Lasiter ................. H05K 1/0306 345/204
2014/0134839 A1 * 5/2014 Kim .................... H01L 29/4236 438/652
2015/0206883 A1 * 7/2015 Lee ................... H01L 27/10814 257/773

FOREIGN PATENT DOCUMENTS

| JP | 2005-101647 A | 4/2005 |
| JP | 2007-128980 A | 5/2007 |
| JP | 2011-14731 A | 1/2011 |
| JP | 2011-54920 A | 3/2011 |
| JP | 2013-55203 A | 3/2013 |
| JP | 2013-89712 A | 5/2013 |

* cited by examiner

*Primary Examiner* — Victor A Mandala
(74) *Attorney, Agent, or Firm* — McDermott Will & Emery LLP

(57) ABSTRACT

A semiconductor device having a capacitor which includes a first electrode electrically coupled to a transistor and a second electrode separate from the first electrode and covered with an interlayer insulating film, in which a plurality of coupling holes are formed in the interlayer insulating film and are in contact with the second electrode at the lower ends; and, when the capacitance of the second electrode is represented by C [nF] and the total area of the lower ends of the coupling holes is represented by A [μm²], the following expression (1) is satisfied.

$$C/A \leq 1.98 \text{ [nF/μm}^2\text{]} \quad (1)$$

The elution of the second electrode constituting the capacitor at the lower ends of the coupling holes is suppressed.

6 Claims, 22 Drawing Sheets

SEMICONDUCTOR DEVICE

CROSS-REFERENCE TO RELATED APPLICATIONS

The disclosure of Japanese Patent Application No. 2014-130052 filed on Jun. 25, 2014 including the specification, drawings and abstract is incorporated herein by reference in its entirety.

BACKGROUND

The present invention relates to a semiconductor device, for example, a technology which can be applied to a semiconductor device having a capacitor.

A capacitor is an electronic device which accumulates charge and is used in, for example, DRAM (Dynamic Random Access Memory). There is a case where a large capacitance is required for the capacitor. The capacitance of the capacitor becomes larger as the surface area of the capacitor increases. Therefore, to obtain a capacitor having a large capacitance, the surface area of the capacitor may be made large.

Meanwhile, it is now desired that the area of a semiconductor chip should be small. To form a capacitor in this semiconductor chip, the planar shape of the capacitor must be made small. Then, as described in, for example, Patent Documents 1 to 5, at present, a capacitor may be formed in the recessed part of a wiring layer. This capacitor can obtain a large surface area with the inner side surface of the recessed part and have a small planar shape.

The above capacitor has two electrodes sandwiching a capacitance insulating film. One (for example, an upper electrode in the case of a capacitor formed by using the above recessed part) of the two electrodes may be electrically coupled to a ground potential. When the capacitor is covered with an insulating film (for example, an interlayer insulating film) in this case, coupling holes must be formed in this insulating film. There is a case where the electrode in contact with the lower ends of the coupling holes of the capacitor electrically floats when the coupling holes are formed.

Patent Document 6 teaches that the electrode which is electrically floating may be charged by reactive ion etching (RIE) when the coupling holes are formed. In this case, an electric field is produced by the above charge between the two electrodes sandwiching the capacitance insulating film. The Patent Document 6 discloses that the pressure resistance of the capacitance insulating film may be reduced by this electric field. Then, the Patent Document 6 teaches that ultraviolet light is applied to the bottoms of the coupling holes. The Patent Document 6 also teaches that an electron accumulated in this electrode is removed by ultraviolet light even when the electrically floating electrode is charged as described above.

RELATED ART DOCUMENTS

Patent Documents

[Patent Document 1]
 Japanese Unexamined Patent Application Publication No. 2005-101647
[Patent Document 2]
 Japanese Unexamined Patent Application Publication No. 2011-14731
[Patent Document 3]
 Japanese Unexamined Patent Application Publication No. 2011-54920

[Patent Document 4]
 Japanese Unexamined Patent Application Publication No. 2013-55203
[Patent Document 5]
 Japanese Unexamined Patent Application Publication No. 2013-89712
[Patent Document 6]
 Japanese Unexamined Patent Application Publication No. 2007-128980

SUMMARY

When the capacitor is covered with the insulating film (for example, an interlayer insulating film) as described above, coupling holes may be formed in this insulating film. As described above, there is a case where the electrode located at the lower ends of the coupling holes of the capacitor electrically floats when the coupling holes are formed. The inventors of the present invention found that the electrode may elute at the lower ends of the coupling holes. Other objects and novel features will become apparent from the description of this specification and the accompanying drawings.

According to an embodiment, the capacitor includes a first electrode and a second electrode. The first electrode is electrically coupled to a transistor. The second electrode is separate from the first electrode. Further, the second electrode is covered with an insulating cover film. A plurality of coupling holes are formed in the insulating cover film. The lower ends of the coupling holes are in contact with the second electrode. When the capacitance of the second electrode is represented by C [nF] and the total area of the lower ends of the coupling holes is represented by A [μm²], the following expression (1) is satisfied.

$$C/A \; 1.98 \; [\mathrm{mF}/\mu\mathrm{m}^2]$$

According to the above embodiment, the second electrode is prevented from eluting at the lower ends of the coupling holes.

DETAILED DESCRIPTION

An embodiment of the present invention will be described hereinunder with reference to the accompanying drawings. In all the drawings, the same reference symbols are given to the same constituent elements and a repeated explanation thereof is omitted.

Figure 1:
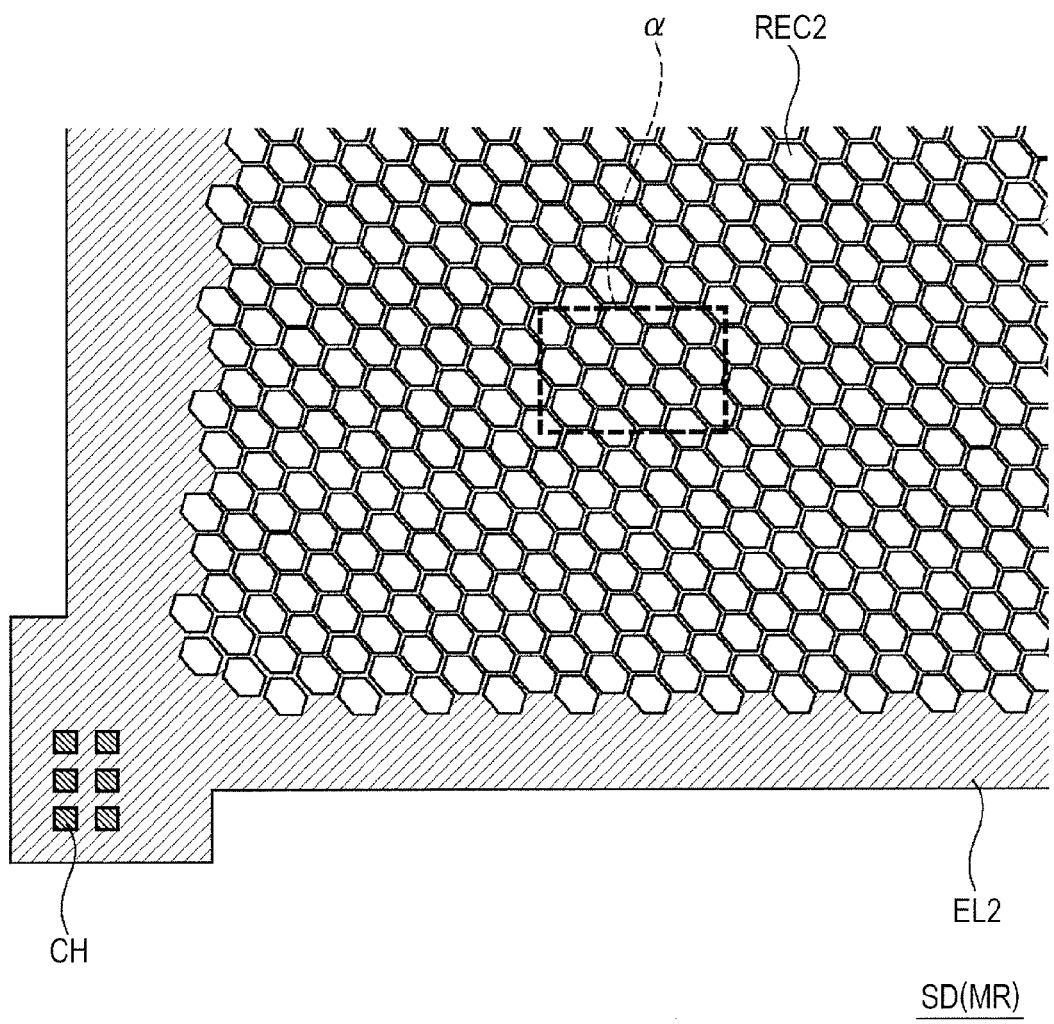
FIG. 1 is a plan view showing the constitution of a semiconductor device according to an embodiment.
Figure 2:
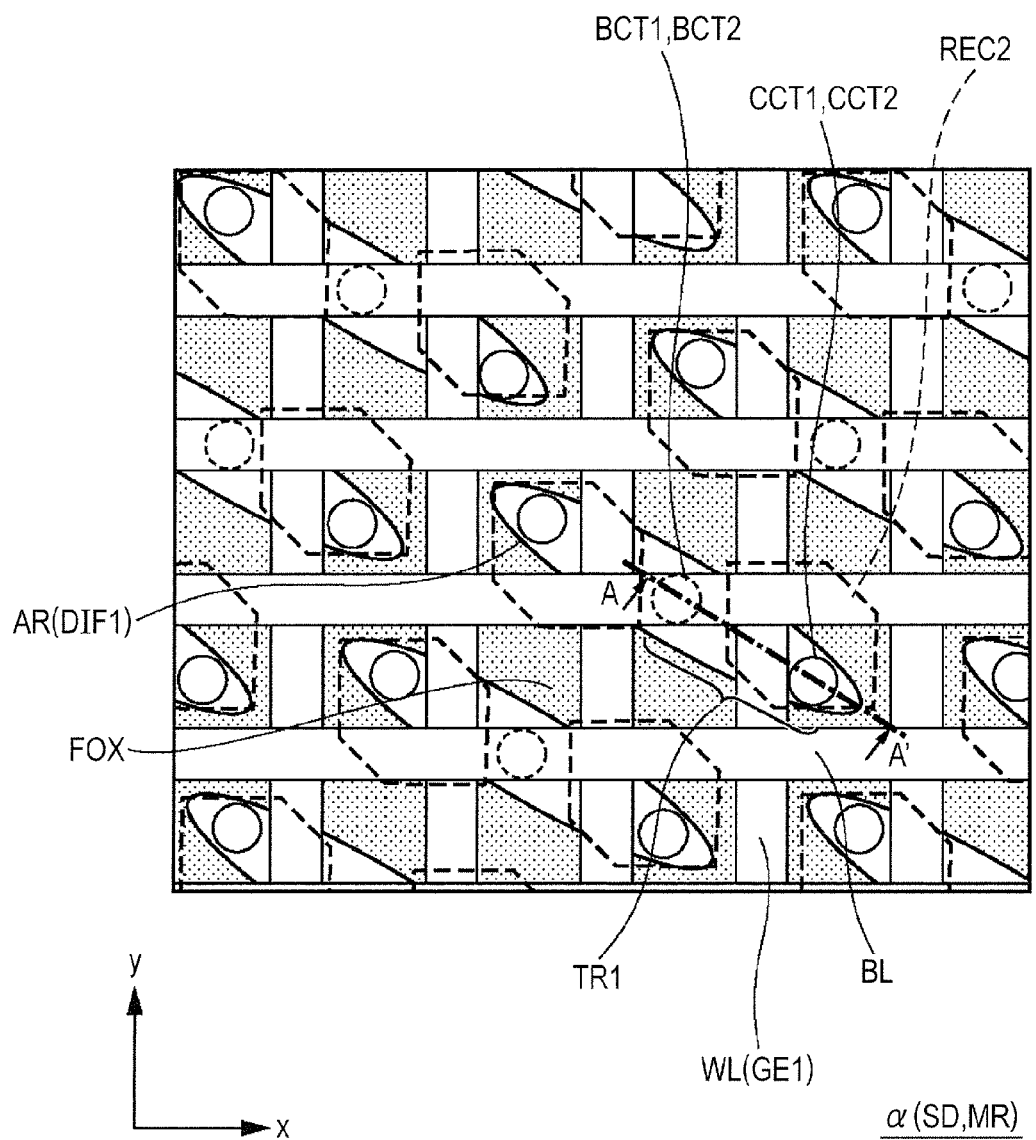
FIG. 2 is an enlarged view of an area surrounded by a broken line α in FIG. 1.
Figure 3:
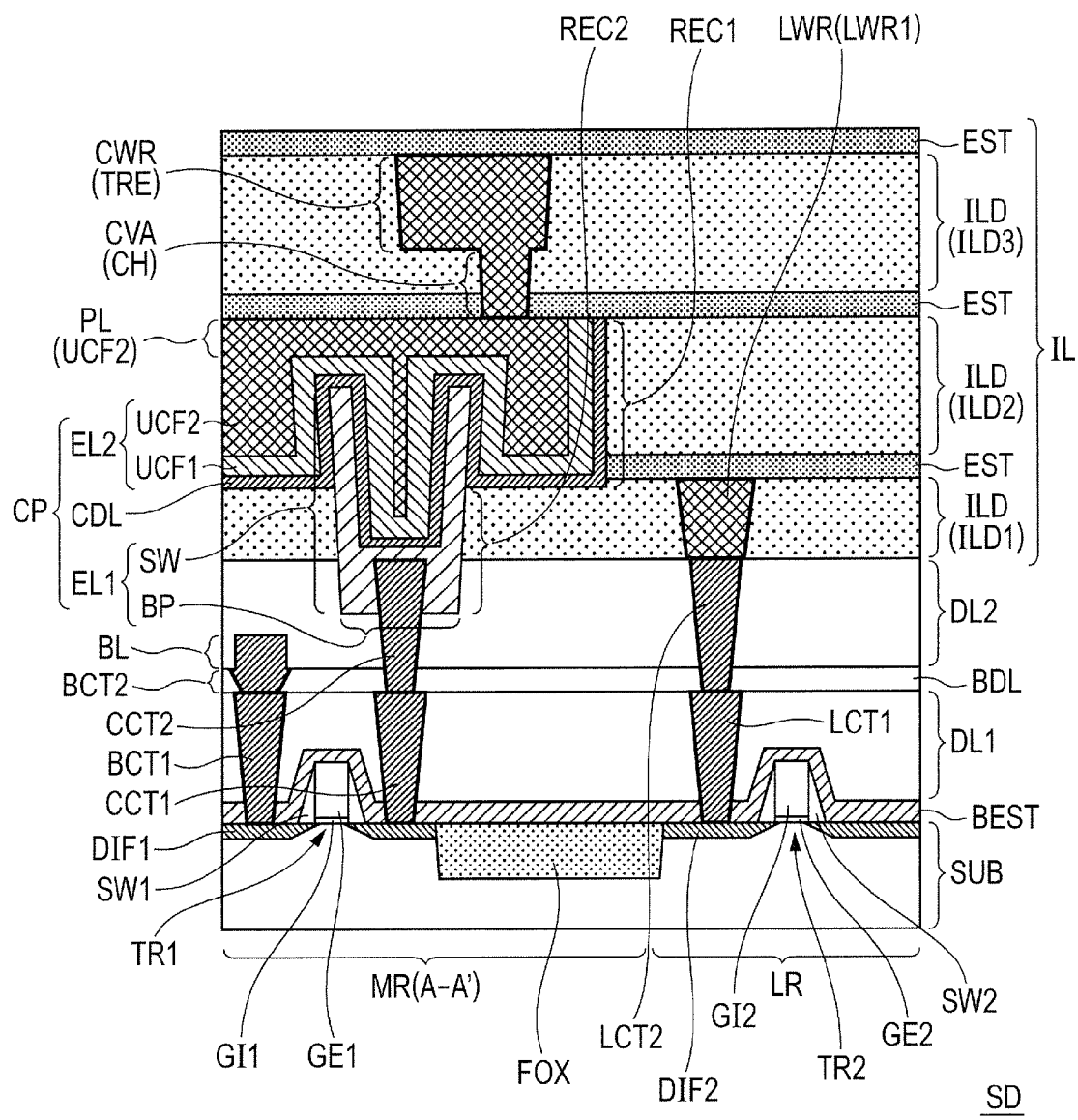
FIG. 3 is a sectional view showing the constitution of a semiconductor device according to the embodiment.

FIG. 1 is a plan view showing the constitution of a semiconductor device SD according to the embodiment. FIG. 2 is an enlarged view of an area surrounded by a broken line α in FIG. 1. FIG. 3 is a sectional view showing the constitution of the semiconductor device SD according to the embodiment. The left side of FIG. 3 corresponds to the sectional view cut on line A-A' of FIG. 2.

As shown in FIG. 3, the semiconductor device SD has a substrate SUB, a transistor TR1 and a capacitor CP. The transistor TR1 is formed over the substrate SUB. The capacitor CP is electrically coupled to the transistor TR1. The capacitor CP includes a first electrode EL1 (lower electrode), a second electrode EL2 (upper electrode) and a capacitance insulating film CDL. The first electrode EL1 is electrically coupled to the transistor TR1. The second electrode EL2 is separate from the first electrode EL1. The capacitance insulating film CDL is situated between the first electrode EL1 and the second electrode EL2. The second electrode EL2 is covered with an interlayer insulating film ILD3 (insulating cover film). As sown in FIG. 1 and FIG. 3, a plurality of coupling holes CH are formed in this interlayer insulating film ILD3. As shown in FIG. 3, the lower end of each of the coupling holes CH is in contact with the second electrode EL2. A via CVA is embedded in each of the coupling holes CH. When the capacitance of the second electrode EL2 is represented by C [nF] and the total area of the lower ends of the coupling holes CH is represented by A [μm²], the following expression (1) is satisfied. This is described in detail hereinunder.

$$C/A \leq 1.98 \, [mF/\mu m^2] \tag{1}$$

A description is first given of the sectional structure of the semiconductor device SD with reference to FIG. 3. The semiconductor device SD has a memory cell and a logic circuit over the substrate SUB. Stated more specifically, the substrate SUB has a memory region MR and a logic region LR. The semiconductor device SD has a memory cell in the memory region MR and a logic circuit in the logic region LR. The substrate SUB is, for example, a semiconductor substrate (for example, a silicon substrate) or an SOI (Silicon on Insulator) substrate.

The above memory cell includes the transistor TR1 and the capacitor CP. The capacitor CP is electrically coupled to one (diffuse layer DIF1) of the source and drain of the transistor TR1. A bit line BL is electrically coupled to the other (diffuse layer DIF1) of the source and drain of the transistor TR1. In contrast to this, the above logic circuit includes a transistor TR2. In the example shown in the figure, the transitory TR1 and the transistor TR2 are separated from each other by a field oxide film FOX (inter-element separation layer). The field oxide film FOX is formed by, for example, STI (Shallow Trench Isolation) or LOCOS (LOCal Oxidation of Silicon).

The transistor TR2 is not limited to a transistor constituting the logic circuit. The transistor TR2 may include the peripheral circuit of the memory region MR. In other words, the transistor TR2 may include a circuit for controlling the transistor TR1. A transistor having the same structure as the above logic circuit is used as this circuit.

The transistor TR1 is coupled to the capacitor CP through contacts CCT1 and CCT2. An etching stop layer BEST, an insulating film DL1, an insulating film BDL and an insulating film DL2 are formed between the transistor TR1 (substrate SUB) and the capacitor CP in this order from the substrate SUB side. The contact CCT1 is formed in the insulating film DL1 and penetrates the insulating film DL1 and the etching stop layer BEST. The contact CCT2 is formed in the insulating film DL2 and penetrates the insulating film DL2 and the insulating film BDL. The bit line BL is formed in the insulating film DL2. Further, the bit line BL is coupled to the transistor TR1 through contacts BCT1 and BCT2 formed in the insulating films DL1 and BDL, respectively.

A wiring layer IL is formed over the insulating film DL2. An interlayer insulating film ILD and an etching stop layer EST are formed in this order repeatedly in the wiring layer IL. As will be detailed hereinafter, a recessed part REC1 and a recessed part REC2 are formed in the wiring layer IL. The capacitor CP is formed by using the recessed part REC1 and the recessed part REC2. As will be detailed hereinafter, the wiring layer IL has a via CVA and a wiring CWR in the memory region MR and a wiring LWR in the logic region LR.

In the example shown in the figure, the wiring LWR (wiring LWR1) is formed in the interlayer insulating film ILD (interlayer insulating film ILD1) which is the lowest layer of the wiring layer IL. The wiring LWR1 constitutes the above logic circuit together with the transistor TR2. Further, the wiring LWR1 is electrically coupled to the source or drain (diffuse layer DIF2) of the transistor TR2 through contacts LCT1 and LCT2 formed in the insulating films DL1 and DL2 (insulating films below the wiring layer IL), respectively. A via and a wiring are formed by, for example, dual damascene in the interlayer insulating films ILD (for example, interlayer insulating films ILD1 and ILD3) over the wiring LWR1. The via and the wiring also constitute the above logic circuit. For explanation, the via and the wiring are not shown in this figure.

The interlayer insulating films ILD are formed of, for example, a silicon oxide film ($SiO_2$) or a low-k film (for example, SiOCH-based film). The etching stop layer EST is formed of, for example, a silicon nitride film (SiN) or a silicon nitrocarbide film (SiCN).

In the example shown in the figure, the recessed parts REC1 and REC2 are formed in two interlayer insulating films ILD (interlayer insulating films ILD1 and ILD2) which are the lowest layers of the wiring layer IL. The positions of the recessed parts REC1 and REC2 are not limited to those shown in this figure. For example, the recessed parts REC1 and REC2 may be formed in layers above the interlayer insulating films ILD1 and ILD2.

The recessed part REC1 penetrates the interlayer insulating film ILD2. Further, the bottom of the recessed part REC1 penetrates the etching stop layer EST situated between the interlayer insulating films ILD1 and ILD2. The bottom of the recessed part REC1 may not penetrate the etching stop layer EST. For example, the recessed part REC1 may merely enter into the etching stop layer EST or the bottom may be situated above the top surface of the etching stop layer EST.

The recessed part REC2 has an opening at the bottom of the recessed part REC1. The recessed part REC2 penetrates the interlayer insulating film ILD1. Further, in the example shown in the figure, the bottom of the recessed part REC2 enters into the insulating film DL2 (insulating film situated below the wiring layer IL). The bottom of the recessed part REC2 may not enter into the insulating film DL2. For example, the bottom of the recessed part REC2 may be situated above the top surface of the insulating film DL2. In other words, the recessed part REC2 may not penetrate the interlayer insulating film ILD.

The capacitor CP is formed by using the recessed parts REC1 and REC2. Stated more specifically, the capacitor CP has the first electrode EL1, the capacitance insulating film CDL and the second electrode EL2. In the example shown in the figure, the second electrode EL2 is a laminate including a conductive film UCF1 and a conductive film UCF2 which are arranged in this order from the capacitance insulating film CDL side.

The first electrode EL1 has a bottom part BP and a side wall part SW. The bottom part BP is formed along the bottom of the recessed part REC2. The bottom part BP is coupled to the contact CCT2. The upper end of the side wall part SW projects from the opening of the recessed part REC2 along the side surface of the recessed part REC2. This upper end reaches between the above opening of the recessed part REC and the top surface of the interlayer insulating film ILD2. The first electrode EL1 is formed from, for example, titanium nitride (TiN). The material of the first electrode EL1 is not limited to this.

The capacitance insulating film CDL covers the bottom part BP of the first electrode EL1 and the inner wall of the side wall part SW of the first electrode EL1. Further, the capacitance insulating film CDL also covers the outer wall of a portion projecting from the opening of the recessed part REC2 of the side wall part SW of the first electrode EL1. In the example show in the figure, the capacitance insulating film CDL is formed along the bottom part BP of the first electrode EL1 and the inner wall and the outer wall of the side wall part SW of the first electrode EL1. The capacitance insulating film CDL is formed from, for example, a high-k material (for example, zirconia ($ZrO_2$)). The material of the capacitance insulating film CDL is not limited to this.

The second electrode EL2 covers the capacitance insulating film CDL. In the example shown in the figure, the second electrode EL2 is formed along the bottom part BP of the first electrode EL1 and the above inner wall and outer wall of the side wall part SW of the first electrode EL1 like the capacitance insulating film CDL. In this embodiment, the conductive film UCF1 is formed from titanium nitride (TiN) and the conductive film UCF2 is formed from tungsten (W). In other words, the second electrode EL2 is a laminate (W/TiN) including a titanium nitride (TiN) film and a tungsten (W) film which are arranged in this order from the capacitance insulating film CDL side. The material of the second electrode EL2 is not limited to this.

As will be detailed hereinafter with reference to FIG. 1, a plurality of recessed parts REC2 are formed in the bottom of one recessed part REC1. The first electrode EL1 is provided for each of the recessed parts REC2. In this case, the first electrodes EL1 of the recessed parts REC2 are separate from one another. Meanwhile, the capacitance insulating film CDL and the second electrode EL2 are formed across the recessed parts REC2. In other words, one capacitance insulating film CDL and one second electrode EL2 are provided for the first electrodes EL1.

Further, in the example shown in the figure, the conductive film UCF2 (upper conductive film) of the second electrode EL2 becomes a plate PL above the upper end of the side wall part SW of the first electrode EL1. In the example shown in the figure, the plate PL covers the recessed parts REC2 thereby. As will be detailed hereinafter, the thickness of the plate PL may be, for example, 10 nm or more. The thickness of the plate PL is not limited to this.

The wiring CWR and the via CVA are formed in the interlayer insulating film ILD (interlayer insulating film ILD3) above the second electrode EL2. The wiring CWR and the via CVA are formed by, for example, dual damascene, and the via CVA is formed in the bottom of the wiring CWR. The wiring CWR and the via CVA are formed of a conducive member (for example, a metal such as copper (Cu) or tungsten (W)) embedded in the trench TRE and the coupling hole CH formed in the interlayer insulating film ILD3, respectively. In this case, the lower end of the coupling hole CH is in contact with the outermost surface (conductive film UCF2) of the second electrode EL2.

The coupling hole CH becomes narrower in width from the top surface toward the bottom surface of the interlayer insulating film ILD3. The planar shape of the upper end of the coupling hole CH is not particularly limited and may be determined based on, for example, the process rule of the semiconductor device SD. For example, when the width of a wiring (for example, a word line WL (FIG. 2), a bit line BL (FIG. 2) or a wiring LWR1 (wiring of the lowest layer of the wiring layer IL)) is 28 nm or less, the planar shape of the upper end of the coupling hole CH may be circular with a diameter of 45 nm or less. The planar shape of the upper end of the coupling hole CH is not limited to this.

The wiring CWR and the via CVA are electrically coupled to, for example, a ground potential. Thereby, the second electrode EL2 (upper electrode) of the capacitor CP is electrically coupled to the ground potential. The wiring CWR and the via CVA may be electrically coupled to a potential different from the ground potential.

A description is subsequently given of the planar layout of the recessed parts REC2, the second electrodes EL2 (upper electrodes of the capacitors CP) and the coupling holes CH with reference to FIG. 1. For explanation, in this figure, the relative size of the coupling hole CH with respect to the recessed part REC2 is larger than its actual size. Therefore, the ratio of the size of the coupling hole CH shown in this figure and the size of the recessed part REC2 shown in this figure does not suggest the ratio of the actual size of the coupling hole CH and the actual size of the recessed part REC2.

As shown in the figure, the planar shape of the recessed part REC2 is hexagonal. All the recessed parts REC2 have the same planar shape and are arranged regularly in the plan view. More specifically, the planar shape of each recessed part REC2 is hexagonal with a first side, second side, third side, fourth side, fifth side and sixth side which are arranged in this order. The first side and the fourth side are parallel to each other and have the same length. Similarly, the second side and the fifth side are parallel to each other and have the same length. Similarly, the third side and the sixth side are parallel to each other and have the same length.

Stated more specifically, one recessed part REC2 (central recessed part) is surrounded by six recessed parts REC2 which are translationally symmetrical to the central recessed part REC2. These six recessed parts REC2 are a first recessed part, second recessed part, third recessed part, fourth recessed part, fifth recessed part and sixth recessed part which are arranged in the arrangement directions of the first side, second side, third side, fourth side, fifth side and sixth side of the central recessed part, respectively. The first side of the central recessed part is parallel and opposed to the fourth side of the first recessed part, the second side is parallel and opposed to the fifth side of the second recessed part, the third side is parallel and opposed to the sixth side of the third recessed part, the fourth side is parallel and opposed to the first side of the fourth recessed part, the fifth side is parallel and opposed to the second side of the fifth recessed part, and the sixth side is parallel and opposed to the third side of the fifth recessed part. In other words, when the planar shapes of the recessed parts REC are each regular hexagonal, the recessed parts REC2 form a honeycomb structure.

The planar shape of the second electrode EL2 has a first side and a second side constituting a projected corner. This projected corner projects outward from the first side and the second side. The second electrode EL2 includes the recessed parts REC2 therein in the plan view. Further, the coupling holes CH (coupling holes formed in the interlayer insulating film ILD (interlayer insulating film ILD3) above the capacitor CP in the example shown in FIG. 3) are situated in the above projected corner. In the example shown in the figure, the coupling holes CH are arranged in a 2-D matrix in directions along the above first side and the second side.

The coupling holes CH are situated in a region not overlapping with the recessed parts REC2 in the plan view. Stated more specifically, the coupling holes CH are situated closer to the first side than the recessed parts REC2 when looking in a direction along the first side and closer to the second side than the recessed parts REC2 when looking in a direction along the second side. In this case, at least one of the coupling holes CH may be situated on the outer side of the first side when looking in a direction along the first side or on the outer side of the second side when looking in a direction along the second side.

The specific planar shape of the second electrode EL2 is, for example, such that at least one projected corner out of the four corners of a rectangle is projected outward from the two sides constituting this projected corner. The region where the coupling holes CH are located is not limited to the above projected corner. For example, the coupling holes CH may be arranged along the above first side or the second side.

In the example shown in the figure, the second electrode EL2 and the coupling holes CH are formed to ensure that the above expression (1) is satisfied. Stated more specifically, an "n" ("n" is an integer of 1 or more) number of recessed parts REC2 are formed below the second electrode EL2 (upper electrode), and when the capacitances of the capacitors formed in the recessed parts REC2 are represented by $C_1, C_2, \ldots C_n$ [nF], C [nF] (the capacitance of the second electrode EL2) is given by the following equation (2).

$$C = C_1 + C_2 + \ldots C_n [\text{nF}] \quad (2)$$

When an "m" ("m" is an integer of 1 or more) number of coupling holes CH are in contact with the second electrode EL2 and the areas of the lower ends of the coupling holes CH are represented by $A_1, A_2, \ldots A_m$ ($\mu m^2$), A [$\mu m^2$] (total area of lower ends of coupling holes CH) is given by the following equation (3).

$$A = A_1 + A_2 + \ldots A_m [\mu m^2] \quad (3)$$

In the example shown in the figure, the recessed parts REC2 and the coupling holes CH are formed but the number of the recessed parts REC2 and the number of the coupling holes CH are not limited to those in the example shown in the figure. For example, only one recessed part REC2 may be formed. Similarly, only one coupling hole CH may be formed.

A description is subsequently given of the planar layout of the memory region MR of the semiconductor device SD with reference to FIG. 2. As shown in the figure, the semiconductor device SD has a plurality of bit lines BL, a plurality of word lines WL ad a plurality of active regions AR.

The bit lines BL extend in a first direction (x-axis direction in the figure) in the plan view. The bit lines BL are arranged in a second direction (y-axis direction perpendicular to the x-axis direction in the figure) perpendicular to the first direction in the plan view. The word lines WL extend in the second direction. The word lines WL are arranged in the first direction. Thus, the bit lines BL and the word lines WL constitute a lattice in the plan view. The bit lines BL are formed from a conductive material (for example, a metal such as tungsten, copper or aluminum). The word lines WL are also formed from a conductive material (for example, polysilicon or a metal).

The active regions AR are formed over the surface of the substrate SUB. Further, field oxide films FOX (inter-element separation layers) are formed over the surface layer of the substrate SUB. The field oxide films FOX surround the active regions AR in the plan view. Thereby, the active regions are separated from one another by the field oxide films FOX.

The planar shape of each of the active regions AR is like an island having a longitudinal direction and a transverse direction. In the example shown in the figure, the planar shape of the active region AR is elliptic. The longitudinal directions in the planar shapes of the active regions AR are the same and inclined with respect to the first direction (the x-axis direction in the figure) in the plan view. Each of the active regions AR is divided into three sections by two adjacent word lines WL in the plan view. In this case, the center section out of these three sections overlaps with the bit line BL in the plan view.

In the section where the active region AR overlaps with the bit line BL in the plan view, the contacts BCT1 and BCT2 are formed. The active region AR is electrically coupled to the bit line BL through the contacts BCT1 and BCT2. Further, contacts CCT1 and CCT2 are formed in the both end sections out of the above three sections. The active region AR is coupled to the capacitor CP through the contacts CCT1 and CCT2.

The transistor TR1 is formed in each of the active regions AR. More specifically, part of the word line WL becomes a gate electrode GE1. In this case, the word line WL functions as the gate electrode GE1 in the section where the word line WL overlaps with the active region AR in the plan view. Thereby, the transistor TR1 is formed in a section where the active region AR crosses the word line WL diagonally in the plan view. In other words, in the active region AR, two transistors TR1 are formed by two adjacent word lines WL.

The diffuse layer DIF1 (the source or drain of the transistor TR1) is formed over the surface of the active region AR. The diffuse layer DIF1 of the active region AR is divided into three sections by the word line WL in the plan view. The diffuse layer DIF1 of the central section out of the three sections is shared by the above two transistors TR1. The diffuse layers DIF1 of the other sections are used by the above two transistors TR1 separately.

The active regions AR are arranged regularly over the surface of the substrate SUB in the plan view. More specifically, the contacts BCT1 and BCT2 of the active regions AR are located over intersections between the bit lines BL and a plurality of inclined straight lines which will be described hereinafter. The inclined straight lines extend in a direction where regions surrounded by adjacent bit lines BL and adjacent word lines WL in a lattice formed by the bit lines BL and the word lines WL are butted to one another and aligned. Portions crossing the bit lines BL of two adjacent inclined straight lines are adjacent to each other through four word lines WL in the first direction (the x-axis direction in the figure). The positive or negative inclination in the longitudinal direction of the active region AR in the first direction (the x-axis direction in the figure) is opposite to the positive or negative inclination of the inclined straight line.

Figure 4:
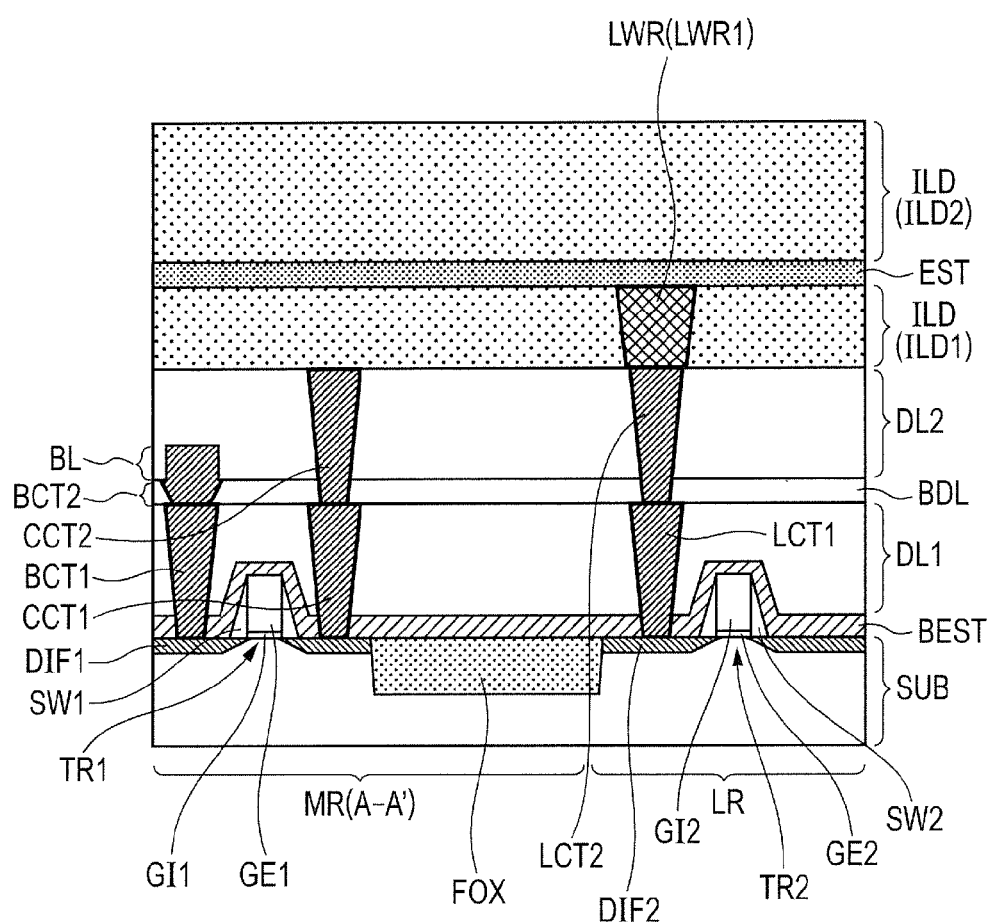
FIG. 4 is a sectional view showing the production process of the semiconductor device shown in FIGS. 1 to 3.

FIGS. 4 to 14 are sectional views showing the production process of the semiconductor device SD shown in FIGS. 1 to 3. As shown in FIG. 4, the transistors TR1 and TR2 are first formed over the substrate SUB.

Stated more specifically, the field oxide film FOX is first formed in the substrate SUB. Subsequently, the insulating film and the polysilicon film are formed over the substrate SUB in this order. This insulating film is an insulating film which will become gate insulating films GI1 and GI2. The above polysilicon film is a conductive film which will become gate electrodes GE1 and GE2. Then, the above insulating film and the polysilicon film are patterned. Thereby, the gate electrode GE1 and the gate insulating film GI1 are formed in the memory region MR, and the gate electrode GE2 and the gate insulating film GI2 are formed in the logic region LR.

Then, an insulating film is formed over the substrate SUB and the gate electrodes GE1 and GE2. This insulating film is an insulating film which will become side walls SW1 and SW2. Then, this insulating film is etched back. Thereby, the side wall SW1 is formed on the side surface of the gate electrode GE1, and the side wall SW2 is formed on the side surface of the gate electrode GE2.

Then, a resist film mask is formed over the gate electrodes GE1 and GE2, the side walls SW1 and SW2 and the field oxide film FOX to inject ions over the surface of the substrate SUB. After this ion injection, the resist film is removed by, for example, ashing. Thereby, the diffuse layer DIF1 (the source and drain of the transistor TR1) is thereby formed in the memory region MR, and the diffuse layer DIF2 (the source and drain of the transistor TR2) is formed in the logic region LR.

Then, the etching stop layer BEST and the insulating film DL1 are formed over the substrate SUB, the gate electrodes GE1 and GE2 and the side walls SW1 and SW2 in this order. Thereafter, the contacts BCT1, the contact CCT1 and the contact LCT1 are formed in the insulating film DL1. Then, the insulating film BDL is formed over the insulating film DL1. Then, the contact BCT2 is formed in the insulating film BDL and the bit line BL is formed over the contact BCT2. In this case, the contact BCT2 and the bit line BL are integrally formed. Then, the insulating film DL2 is formed over the insulating film BDL and the bit line BL. The contacts CCT2 and LCT2 are then formed in the insulating film DL2.

Subsequently, the interlayer insulating film ILD1 (the first interlayer insulating film ILD of the wiring layer IL) is formed over the insulating film DL2 and the contacts CCT2 and LCT2. Then, the wiring LWR1 is formed in the interlayer insulating film ILD1. Next, the etching stop layer EST is formed over the interlayer insulating film ILD1 and the wiring LWR1. Thereafter, the interlayer insulating film ILD2 (the second interlayer insulating film ILD of the wiring layer IL) is formed over the etching stop layer EST.

Figure 5:
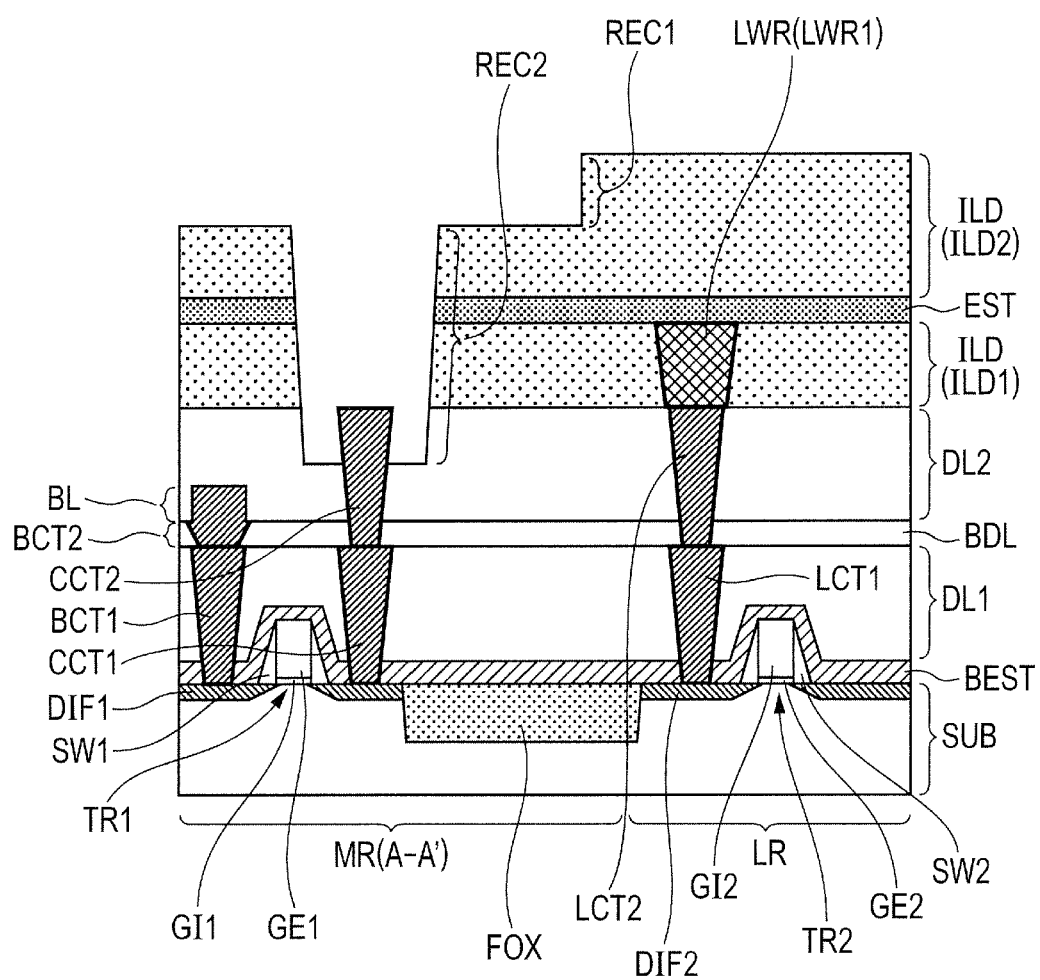
FIG. 5 is a sectional view showing the production process of the semiconductor device shown in FIGS. 1 to 3.

Then, as shown in FIG. 5, the recessed part REC1 is formed in the surface of the interlayer insulating film ILD2 over the memory region MR. In the process shown in this figure, the recessed part REC1 does not penetrate the interlayer insulating film ILD2, and the bottom of the recessed part REC1 merely enters into the interlayer insulating film ILD2. Then, the recessed part REC2 is formed in the recessed part REC1 in the plan view. In the example shown in the figure, the bottom of the recessed part REC2 enters into the insulating film DL2 through the etching stop layer EST and the interlayer insulating film ILD1.

Figure 6:
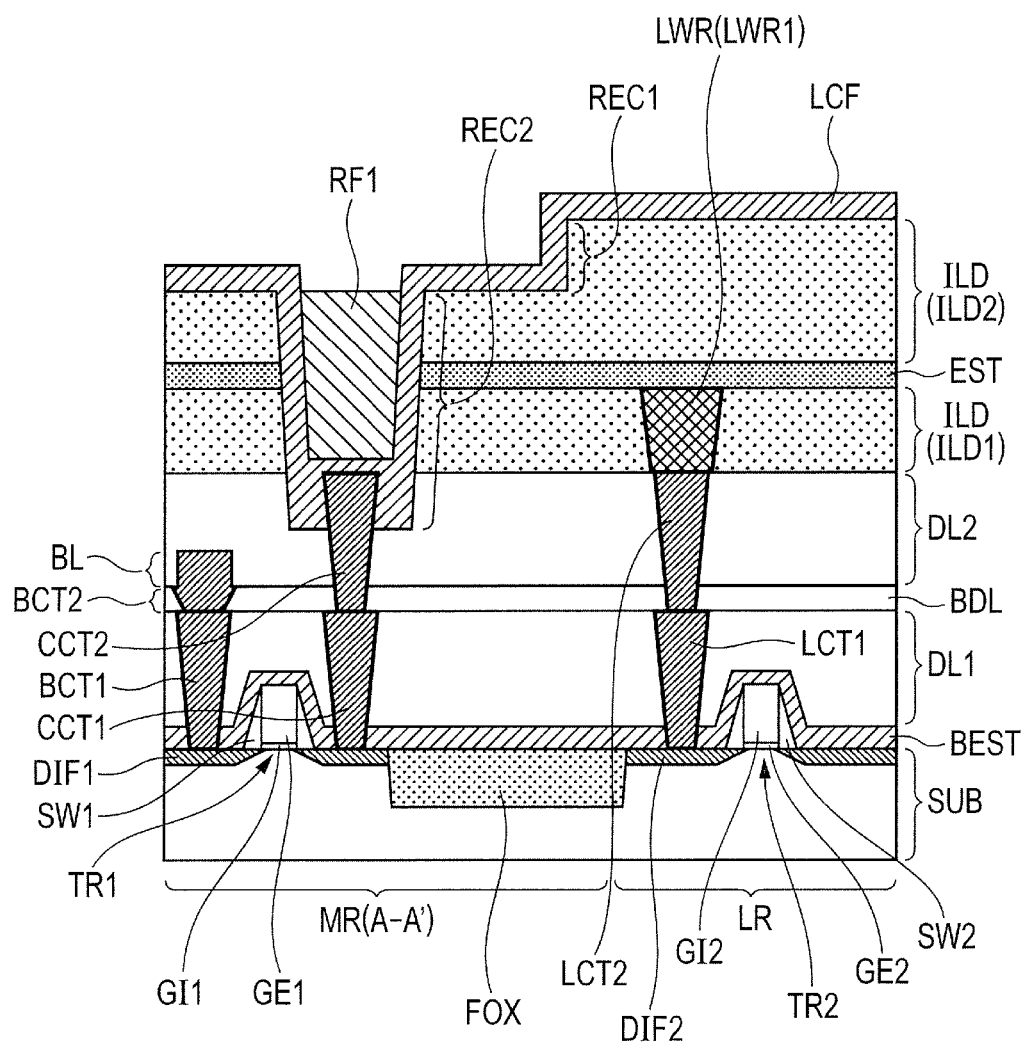
FIG. 6 is a sectional view showing the production process of the semiconductor device shown in FIGS. 1 to 3.

Then, as shown in FIG. 6, the conductive film LCF is formed over the memory region MR by, for example, sputtering. Thereby, the conducive film LCF is formed along the bottoms and the inner side walls of the recessed part REC1 and REC2. The conductive film LCF is a conductive film which will become the first electrode EL1. Then, a resist film RF1 is embedded in the recessed part REC2 by lithography.

Figure 7:
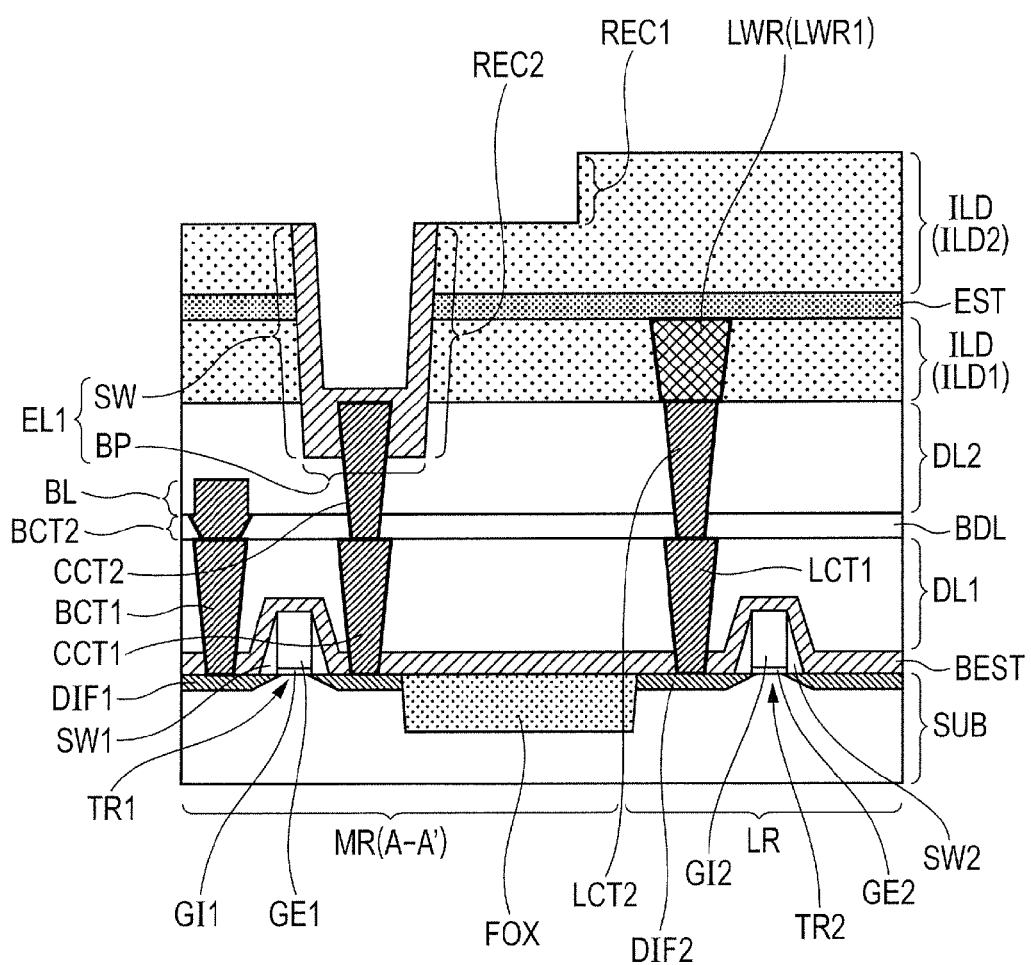
FIG. 7 is a sectional view showing the production process of the semiconductor device shown in FIGS. 1 to 3.

Then, as shown in FIG. 7, the bottom of the recessed part REC1 is etched by using the resist film RF1 as a mask. Thereby, a portion (FIG. 6) situated at the bottom of the recessed part REC1 of the conductive film LCF is removed. Thus, the first electrode EL1 is formed in each of the recessed parts REC2. Then, the resist film RF1 is removed by, for example, ashing.

Figure 8:
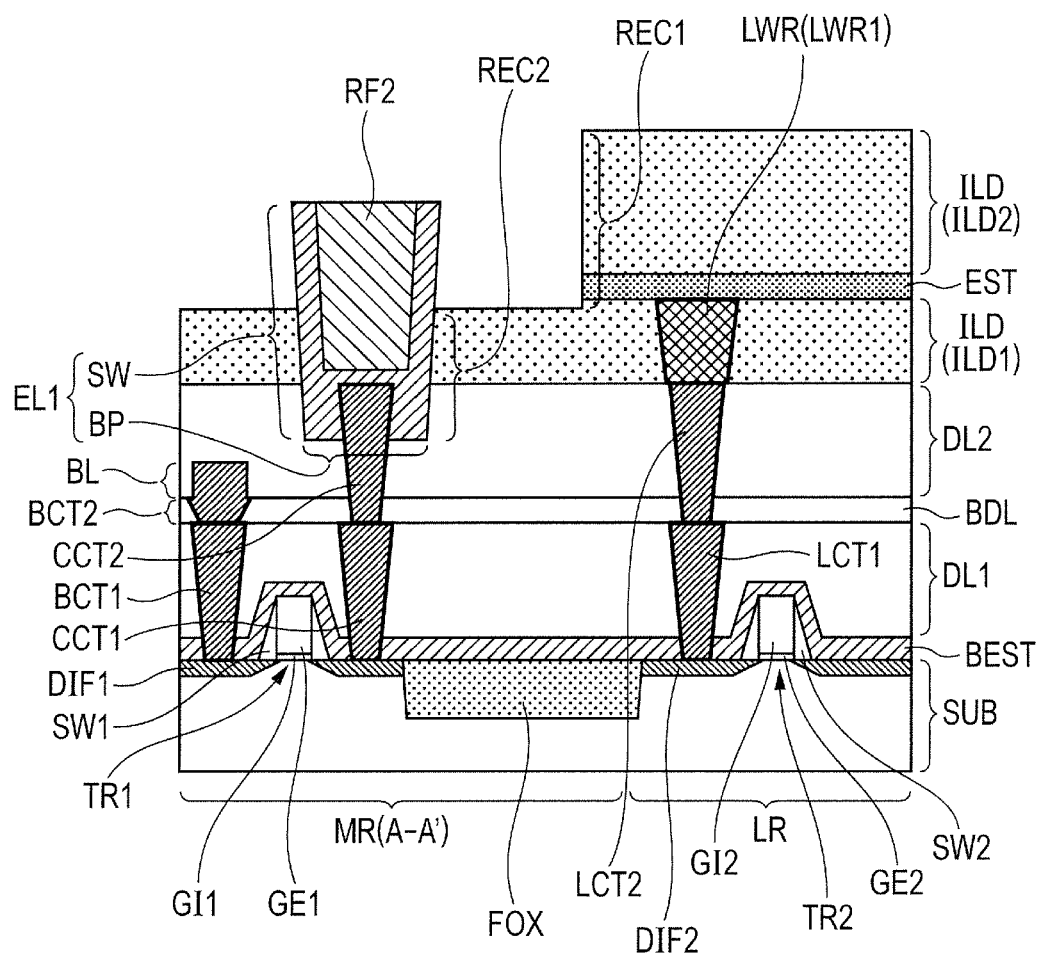
FIG. 8 is a sectional view showing the production process of the semiconductor device shown in FIGS. 1 to 3.

Then, as shown in FIG. 8, a resist film RF2 is embedded in the recessed part REC2 by lithography. Thereafter, the bottom of the recessed part REC1 is etched by using the resist film RF2 as a mask. Thereby, the bottom of the recessed part REC1 penetrates the interlayer insulating film ILD2 and the etching stop layer EST and reaches the interlayer insulating film ILD1. Then, the resist film RF2 is removed by, for example, ashing.

Figure 9:
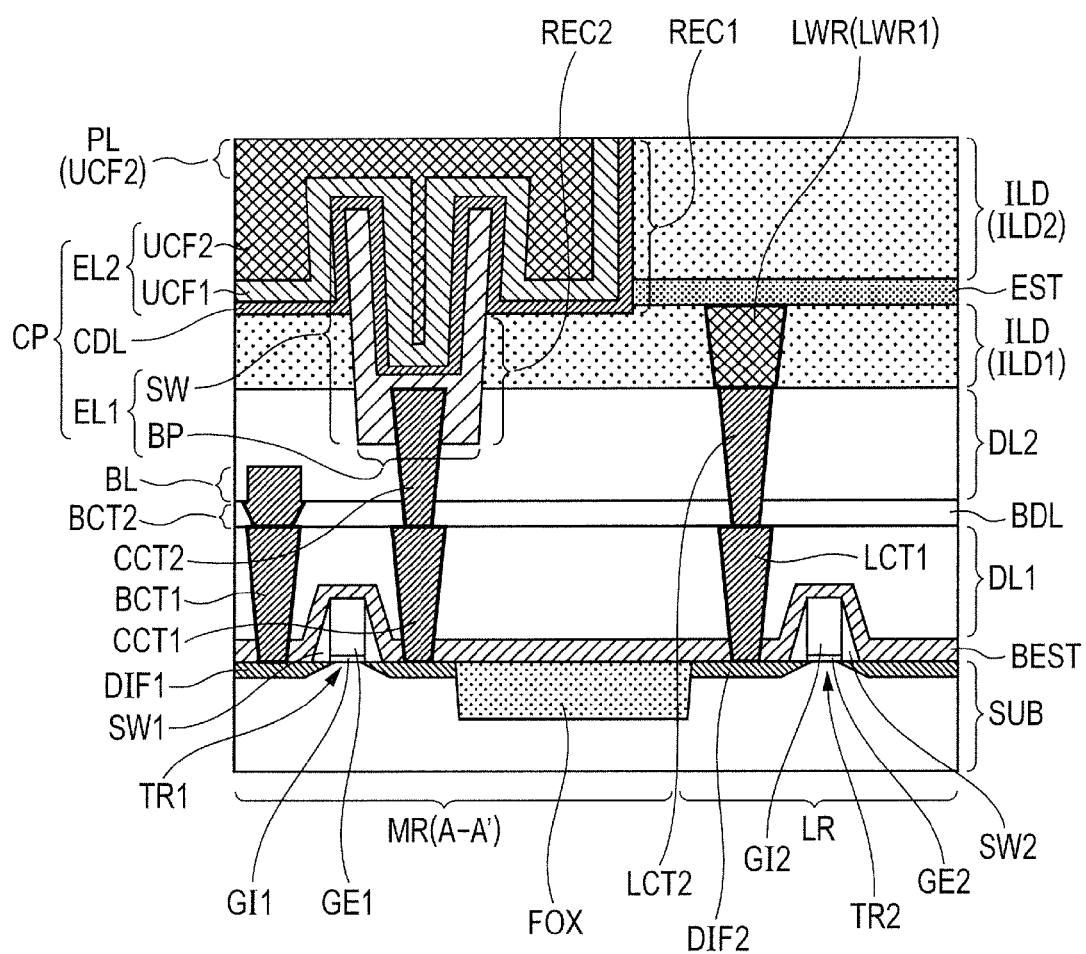
FIG. 9 is a sectional view showing the production process of the semiconductor device shown in FIGS. 1 to 3.

Then, as shown in FIG. 9, the capacitance insulating film CDL and the second electrode EL2 are formed over the first electrode EL1. Thus, the capacitor CP is formed.

Figure 10:
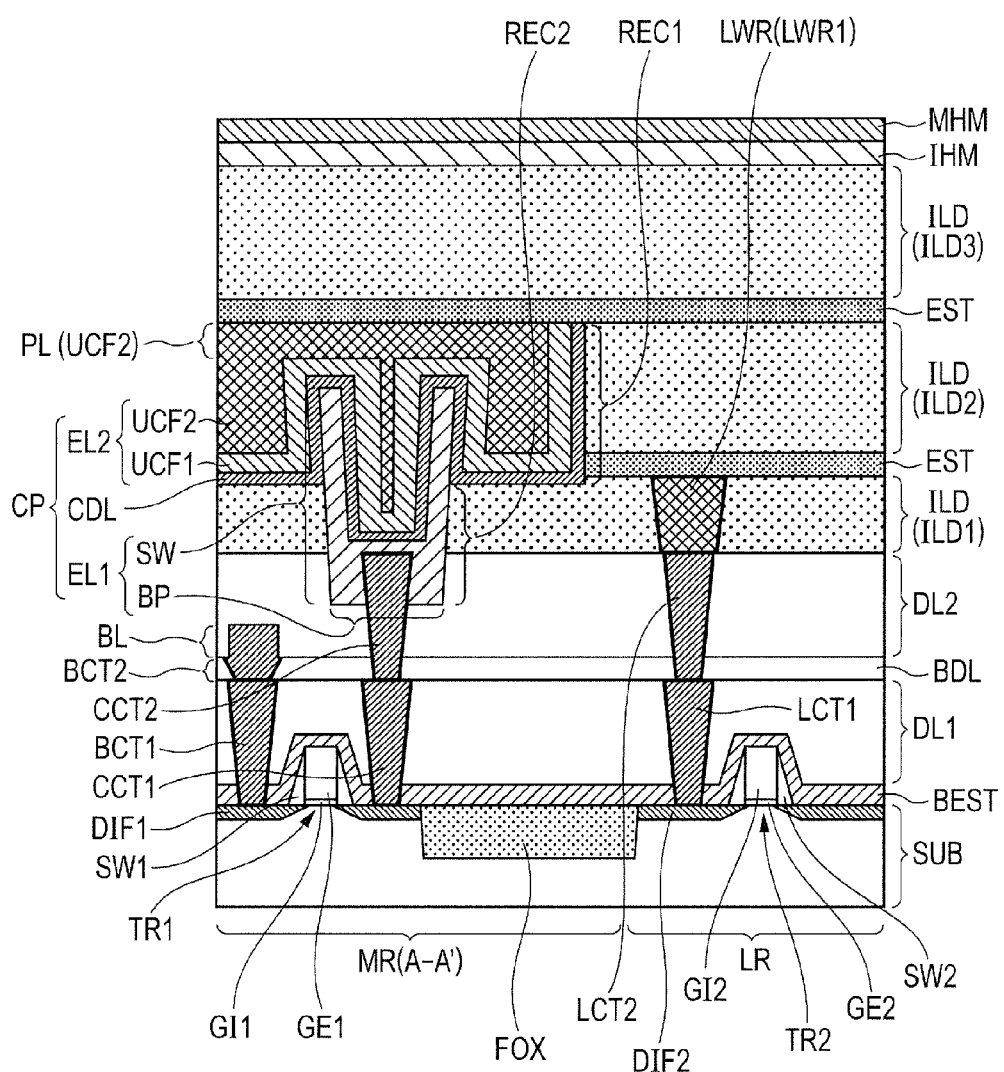
FIG. 10 is a sectional view showing the production process of the semiconductor device shown in FIGS. 1 to 3.

Then, as shown in FIG. 10, the etching stop layer EST and the interlayer insulating film ILD3 (the third interlayer insulating film ILD of the wiring layer IL) are formed over the interlayer insulating film ILD2 and the capacitor CP in this order. Then, an insulating hard mask IHM and a metal hard mask MHM are formed over the interlayer insulating film ILD3 in this order. In the example shown in the figure, the insulating hard mask IHM is formed of, for example, a silicon oxide film ($SiO_2$). Meanwhile, the metal hard mask MHM is formed from, for example, titanium nitride (TiN).

Figure 11:
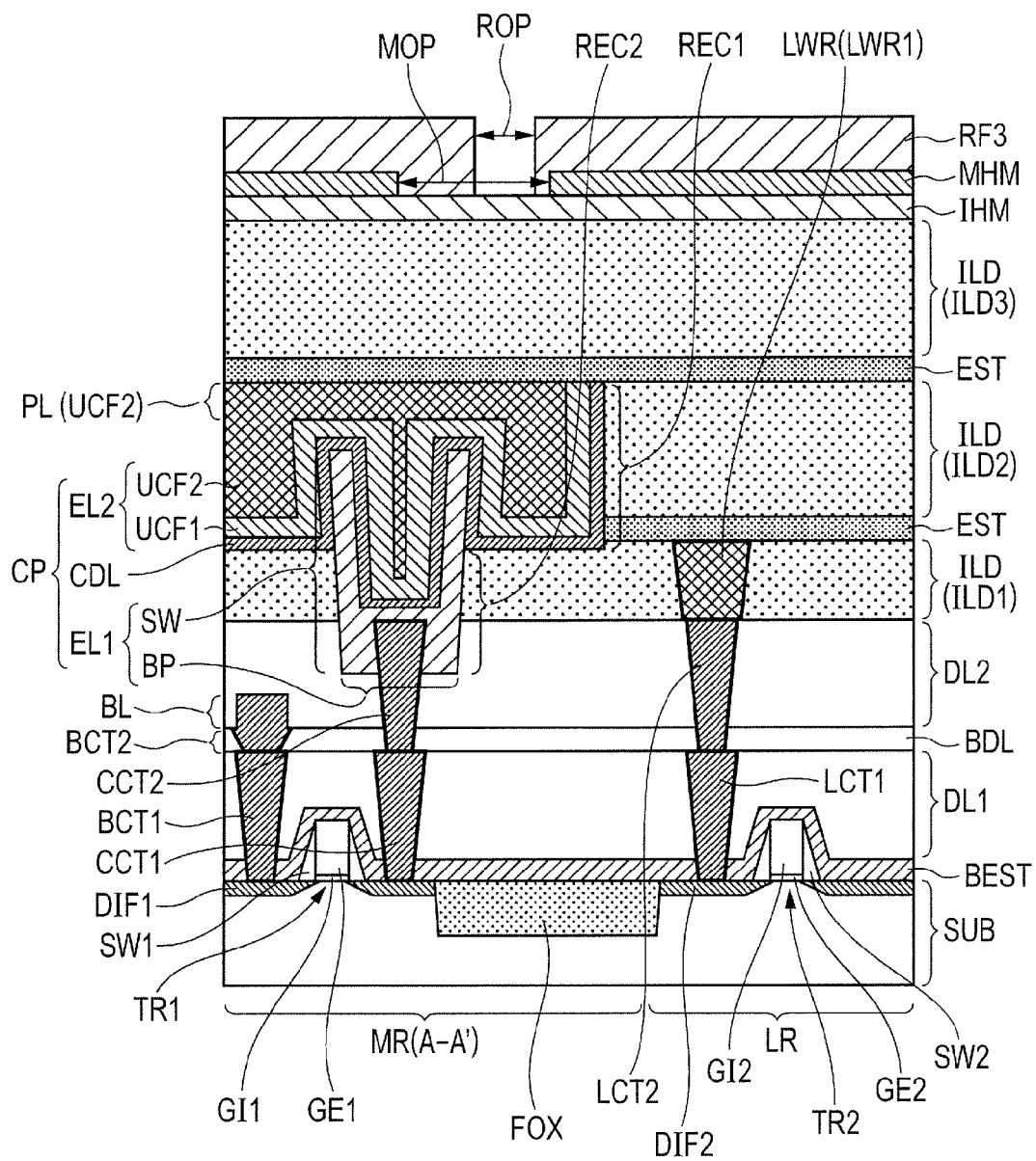
FIG. 11 is a sectional view showing the production process of the semiconductor device shown in FIGS. 1 to 3.

Then, as shown in FIG. 11, an opening MOP is formed in the metal hard mask MHM by lithography. As will be described hereinafter, the planar shape of the wiring CWR (FIG. 3) is determined based on the planar shape of the opening MOP. Then, a resist film RF3 is formed over the metal hard mask MHM and the opening MOP. Thereafter, an opening ROP is formed in the resist film RF3 by lithography. As will be described hereinafter, the planar shape of the via CVA (FIG. 3) is determined based on the planar shape of the opening ROP.

Figure 12:
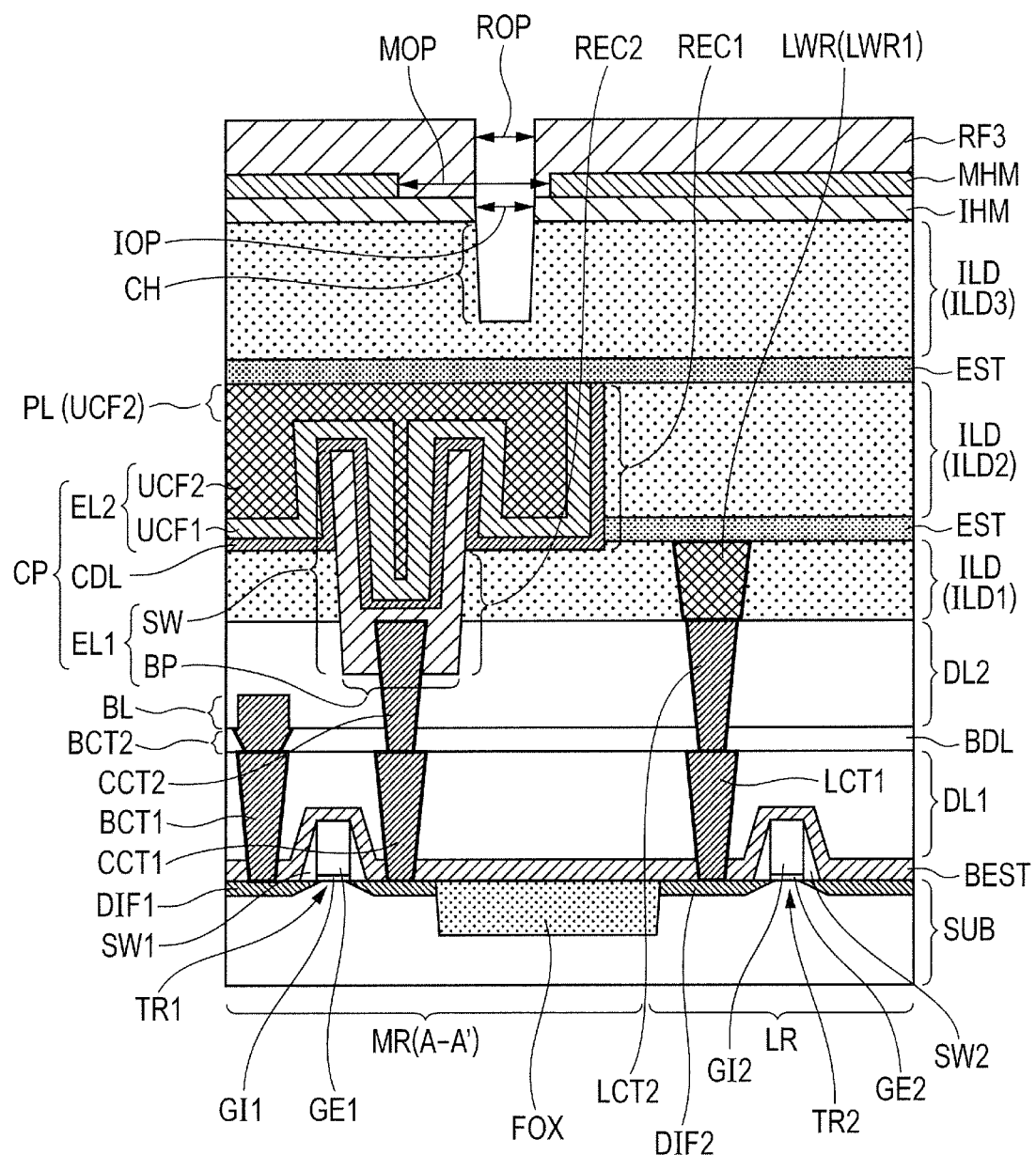
FIG. 12 is a sectional view showing the production process of the semiconductor device shown in FIGS. 1 to 3.

Then, as shown in FIG. 12, the insulating hard mask IHM and the interlayer insulating film ILD3 are etched by using the resist film RF3 as a mask. In this case, etching is carried out by using, for example, reactive ion etching (RIE). Thereby, an opening IOP is formed in the insulating hard mask IHM. Further, the coupling hole CH is formed in the interlayer insulating film ILD3. In the process shown in the figure, the coupling hole CH does not penetrate the interlayer insulating film ILD3, and the bottom thereof merely enters into the interlayer insulating film ILD3.

Figure 13:
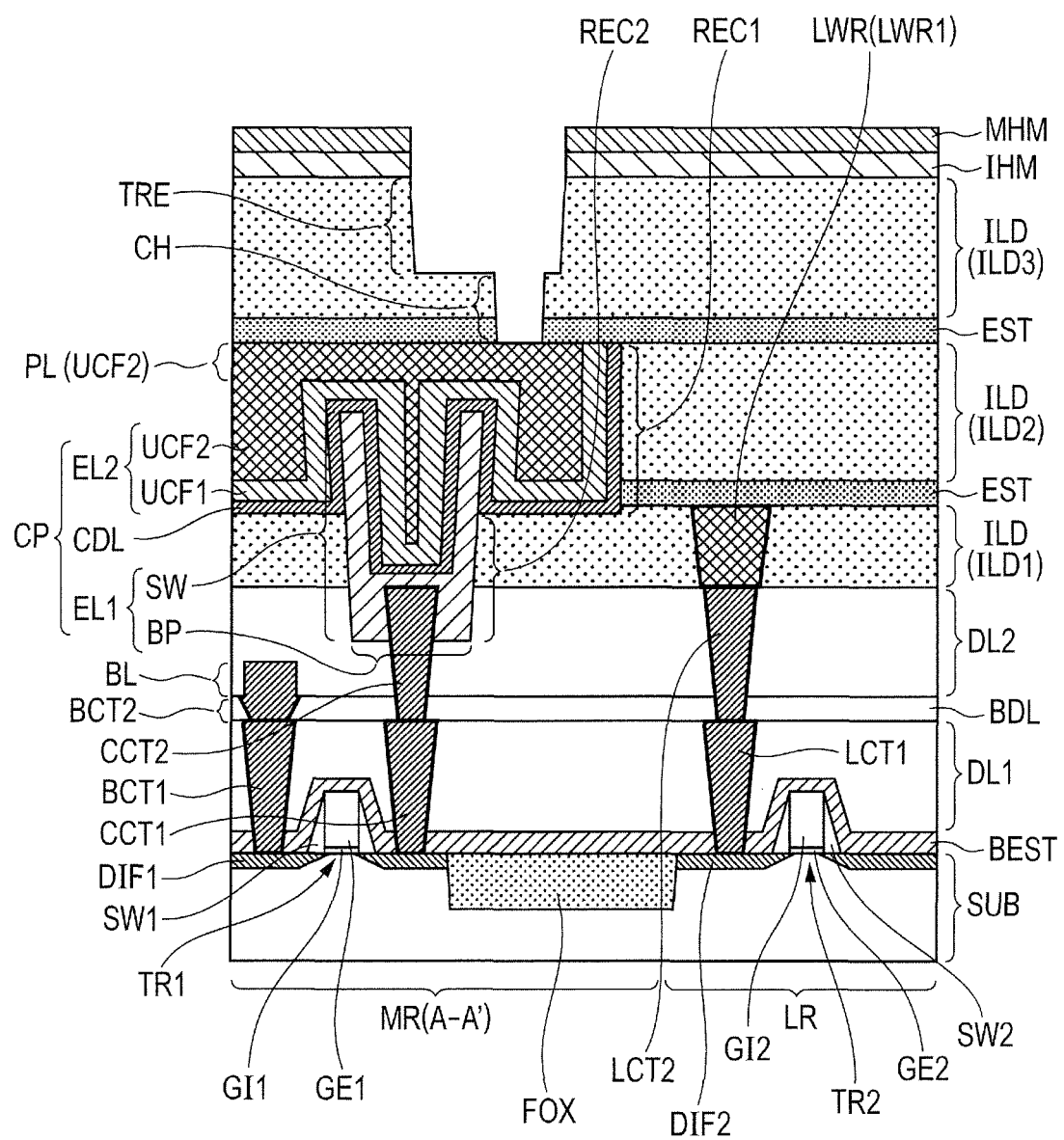
FIG. 13 is a sectional view showing the production process of the semiconductor device shown in FIGS. 1 to 3.

Then, as shown in FIG. 13, the resist film RF3 is removed by, for example, ashing. Thereafter, the insulating hard mask IHM and the interlayer insulating film ILD3 are etched back.

In this case, etch-back is carried out by using RIE. Thereby, a portion on the inner side of the opening MOP of the metal hard mask MHM of the insulating hard mask IHM is removed. Further, the bottom of the coupling hole CH reaches the surface of the second electrode EL2. The trench TRE is formed over the coupling hole CH based on the shape of the opening MOP of the metal hard mask MHM. Then, the metal hard mask MHM and the insulating hard mask IHM are removed. The method of forming the trench TRE and the coupling hole CH is not limited to one shown in this figure. For example, the coupling hole CH may be formed after the formation of the trench TRE.

In the example shown in the figure, when the above etch-back is carried out, the resist film is not formed over the metal hard mask MHM. Therefore, ashing for removing the resist film does not need to be carried out after the trench TRE and the coupling hole CH are formed. This ashing may damage the interlayer insulating film ILD3. Particularly when the interlayer insulating film ILD3 is formed from a low-k material, the dielectric constant of the interlayer insulating film ILD3 may be increased by the above damage. In contrast to this, according to the example shown in the figure, the above damage to the interlayer insulating film ILD3 is prevented.

Figure 14:
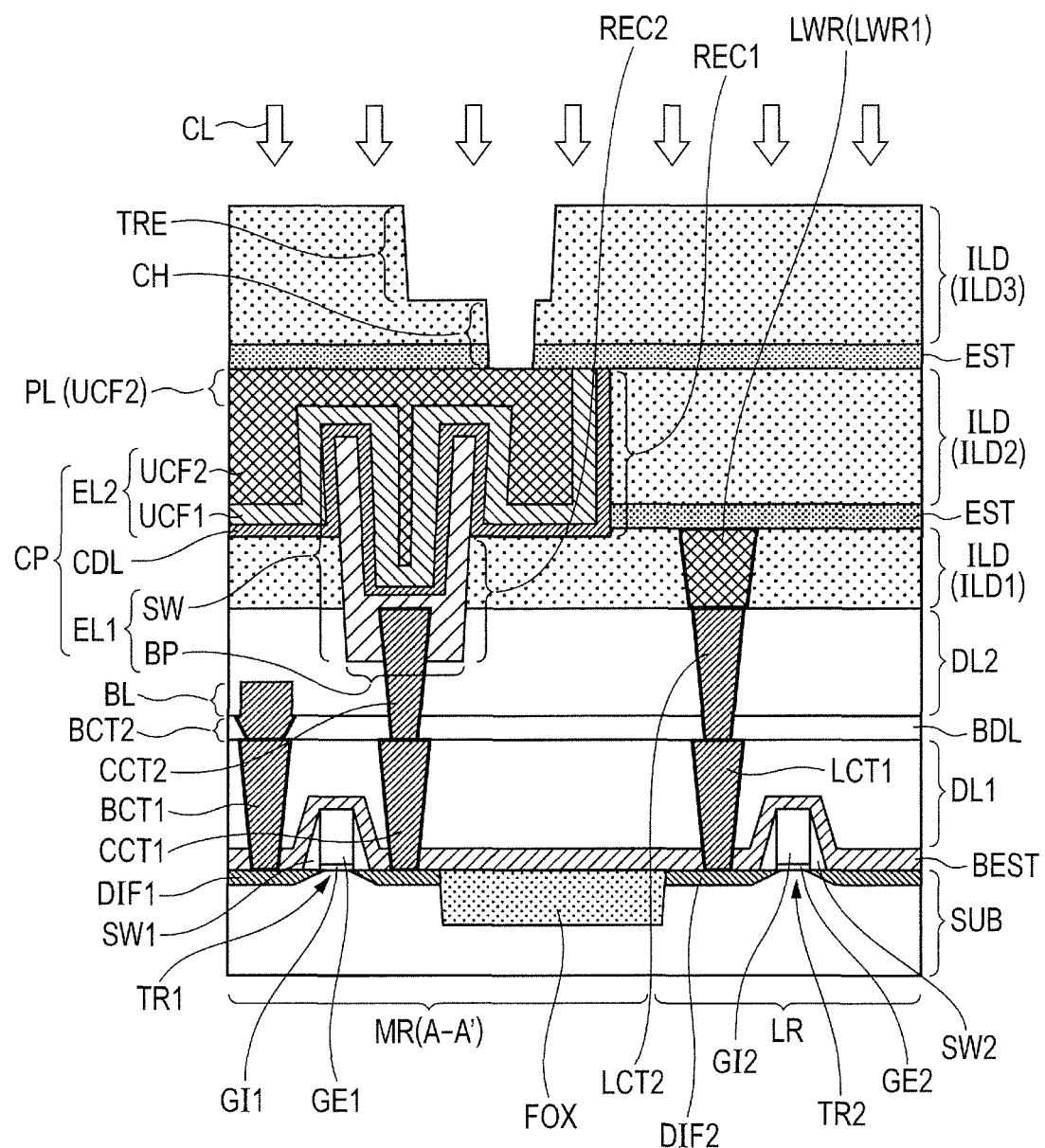
FIG. 14 is a sectional view showing the production process of the semiconductor device shown in FIGS. 1 to 3.

Then, as shown in FIG. 14, a cleaning liquid CL is sprayed on the surface of the interlayer insulating film ILD3 by using, for example, a nozzle. The cleaning liquid CL contains, for example, an organic amine. Thereby, the surface of the interlayer insulating film ILD3, the inner side wall and bottom surface of the trench TRE and the inner side wall and the bottom surface of the coupling hole are cleaned thereby. This cleaning is carried out to remove the residual material produced by etching when the trench and the coupling hole CH are formed. Particularly in the example shown in FIG. 13, a metal derived from the metal hard mask MHM remains. Therefore, cleaning shown in the figure is strongly required when etching in the example shown in FIG. 13 is carried out.

As will be detailed hereinafter, the inventors of the present invention found that the surface of the second electrode EL2 (conductive film UCF2) of the capacitor CP may elute when the surface of the interlayer insulating film ILD3 is cleaned as shown in the figure. As will be detailed hereinafter, the inventors of the present invention found that the elution of the conductive film UCF2 can be suppressed when the capacitor CP and the coupling hole CH are formed to ensure that the above expression (1) is satisfied.

Then, a conductive member (for example, copper (Cu)) is embedded in the trench TRE and the coupling hole CH. Thereby, the wiring CWR and the via CVA are formed. Then, the etching stop layer EST is formed over the interlayer insulating film ILD3 and the wiring CWR. Thus, the semiconductor device SD shown in FIGS. 1 to 3 is manufactured.

Figure 15:
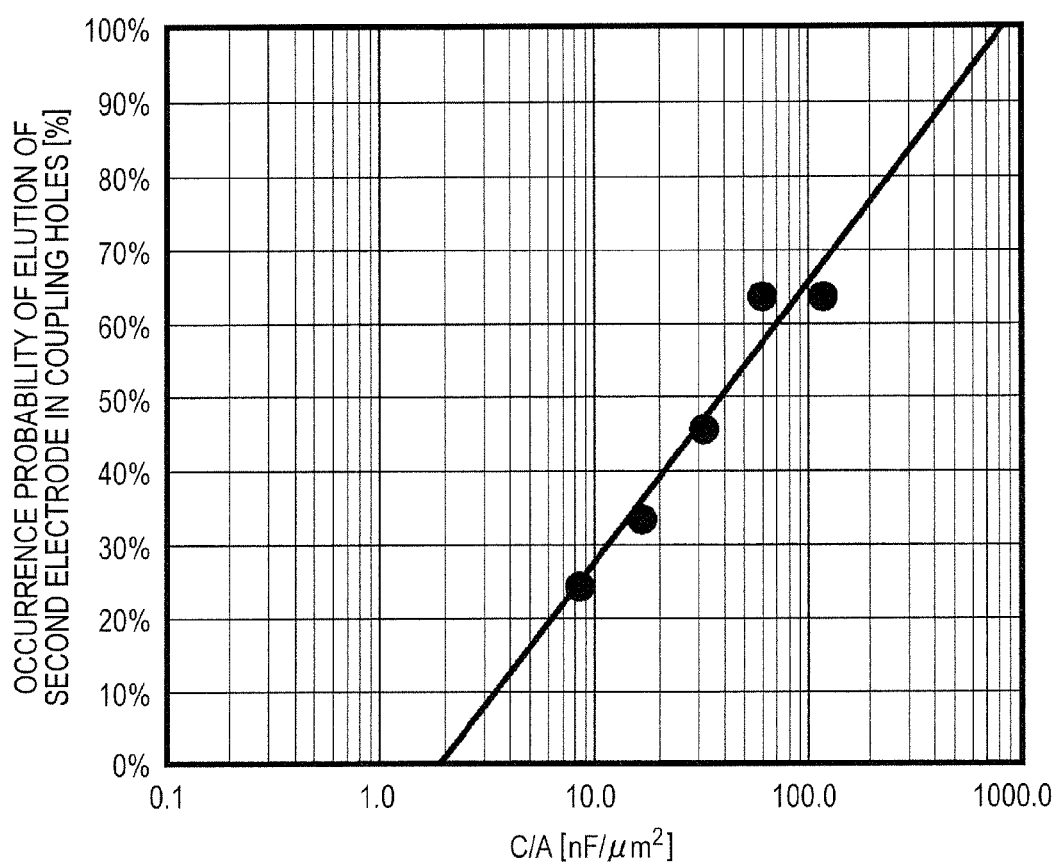
FIG. 15 is a graph showing the relationship between C/A of the expression (1) and the occurrence probability of the elution of the second electrode in the coupling hole.

FIG. 15 is a graph showing the relationship between C/A of the above expression (1) and the occurrence probability of the elution of the second electrode EL2 in the coupling hole CH. The occurrence probability of elution means the percentage of coupling holes in which the elution of the second electrode EL2 (upper electrode of the capacitor CP) at the lower end is confirmed out of the coupling holes CH.

The inventors of the present invention formed the planar layouts in various sizes of the coupling hole CH and the recessed part REC2 (for example, FIG. 1). As a result, the results of a plurality of plots shown in this graph were obtained. A straight line shown in the graph was obtained by fitting these plots. As obvious from the graph, when the above expression (1) is satisfied, the above occurrence probability of elution becomes 0%. Thereby, it can be said that, when the above expression (1) is satisfied, the elution of the second electrode EL2 (upper electrode of the capacitor CP) at the lower end of the coupling hole CH can be suppressed.

The threshold value (in the expression (1), this is 1.98 nF/μm²) that the above occurrence probability becomes 0% for C/A may somewhat fluctuate. Therefore, to set the above occurrence probability to 0% without fail, C/A preferably satisfies C/A≤1.50 [nF/μm²].

The cause for the elution of the second electrode EL2 (conductive film UCF2) may be as follows. In this embodiment, as shown in FIG. 12 and FIG. 13, the trench TRE and the coupling hole CH are formed in the interlayer insulating film ILD3 by, for example, RIE. In this stage, the second electrode EL2 (upper electrode of the capacitor CP) is electrically floating. Therefore, in this stage, the second electrode EL2 is apt to be charged from outside. Therefore, the second electrode EL2 may be charged by RIE. More specifically, in this case, the second electrode EL2 may be positively charged and the interlayer insulating film ILD3 may be negatively charged.

Further in this embodiment, as shown in FIG. 14, the cleaning liquid CL is sprayed on the interlayer insulating film ILD3. Thereby, friction occurs between the cleaning liquid CL and the surface of the interlayer insulating film ILD3. Therefore, the interlayer insulating film ILD3 may be negatively charged. In this case, a positive charge is induced in the second electrode EL2.

As described above, in this embodiment, when the cleaning liquid CL is sprayed on the interlayer insulating film ILD3 (FIG. 14), the second electrode EL2 may be positively charged and the interlayer insulating film ILD3 may be negatively charged. In this case, when the cleaning liquid CL is filled into the trench TRE and the coupling hole CH (FIG. 14), a battery may be constituted parasitically by the cleaning liquid CL, the second electrode EL2 and the interlayer insulating film ILD3. Thereby, the second electrode EL2 may elute.

In contrast to this, in this embodiment, the second electrode EL2 and the coupling hole CH are formed to ensure that the above expression (1) is satisfied. The expression (1) means that the charged amount of the second electrode EL2 at the lower end of the coupling hole CH is small. Therefore, it can be said that, when the expression (1) is satisfied, the above parasitic battery is hardly formed in the coupling hole CH. It can be said that the elution of the second electrode EL2 is suppressed thereby.

As described above, according to this embodiment, the coupling hole CH is formed on the second electrode EL2 (upper electrode) of the capacitor CP. The lower end of the coupling hole CH is in contact with the second electrode EL2. The second electrode EL2 and the coupling hole CH are formed to ensure that the above expression (1) is satisfied. Thereby, the elution of the second electrode EL2 at the lower end of the coupling hole CH is suppressed.

The suppression of the elution of the second electrode EL2 when the above expression (1) is satisfied is realized not only when the coupling holes CH are concentrated in part of the area of the second electrode EL2 as shown in FIG. 1 but also when the coupling holes CH are evenly arranged in the whole second electrode EL2. When the inventors of the present invention investigated the cause of this, it can be that the potential of the whole surface of the second electrode EL becomes almost uniform in the step of forming the trenches TRE and the coupling holes CH (FIG. 14). Thereby, the expression (1) can be satisfied without limiting the layout of the coupling holes CH in this embodiment.

When the potential of the whole surface of the second electrode EL2 becomes almost uniform in the step of forming the trenches TRE and the coupling holes CH (FIG. 14) as described above, the above expression (1) can be satisfied without limiting the layout of the coupling holes CH. Then, to make the potential of the whole surface of the second electrode EL2 almost uniform without fail, for example, the plate PL (the outermost surface of the second electrode EL2) (FIG. 3) may be formed from a metal having low electric resistance (for example, tungsten (W) or copper (Cu)). More specifically, the plate PL may be formed from a metal having an electric resistivity at 25° C. of 1.68 to 28.00 μΩ·cm. Or, the thickness of the plate PL may be set to 10 nm or more.

In this embodiment, as described above, the second electrode EL2 (upper electrode) of the capacitor CP is electrically coupled to the ground potential. The coupling holes CH are formed to apply a ground potential to the second electrode EL2. In this case, when the layout of the coupling holes CH is designed based on an ordinary design idea, it is considered that the ground potential is applied to the second electrode EL2. In other words, the design of the layout of the coupling holes CH in consideration of the electrical floating and charging of the second electrode EL2 is not included in the above ordinary design idea. In contrast to this, the design of the layout of the coupling holes CH based on the above expression (1) is knowledge that the inventors of the present invention newly obtained in this embodiment.

Modification 1

Figure 16:
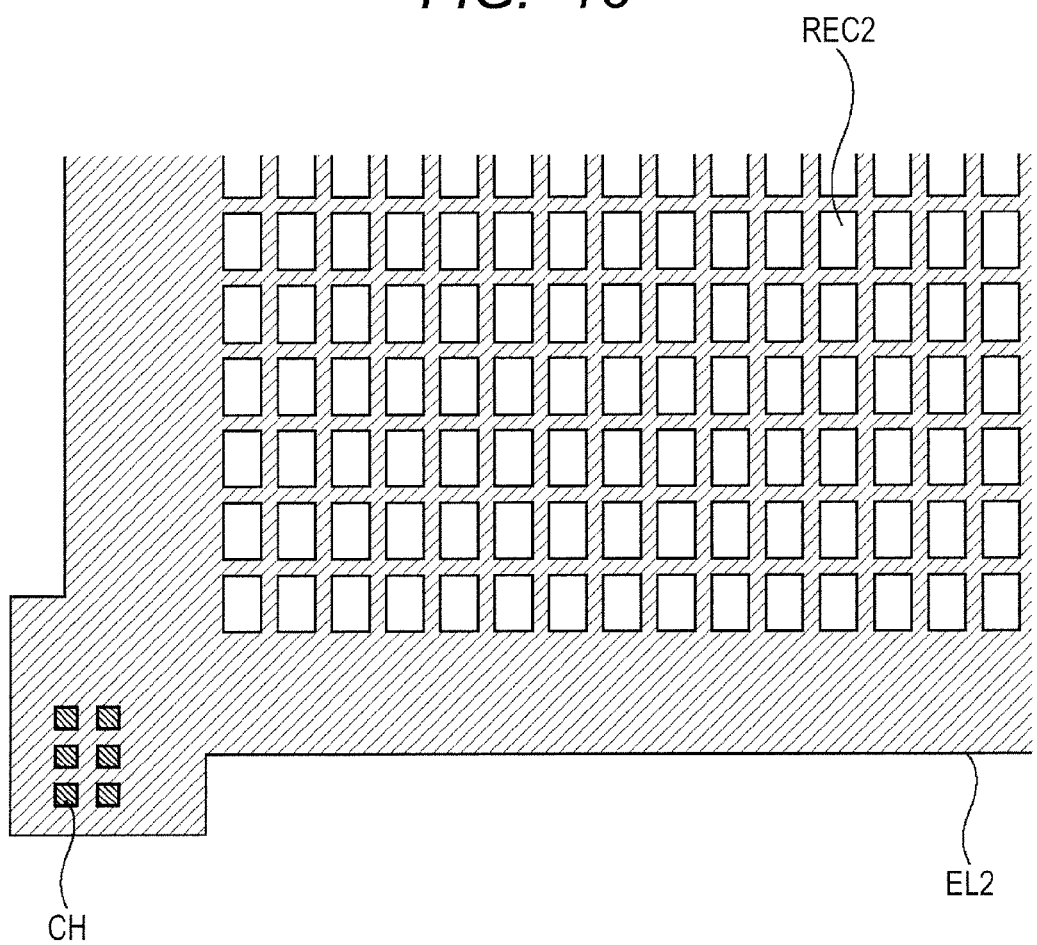
FIG. 16 is a plan view showing a modification of FIG. 1.

FIG. 16 is a plan view showing a modification of FIG. 1. This modification is the same as the above embodiment except for the planar shape of the recessed part REC2. Stated more specifically, in this modification, the planar shape of the recessed part REC2 is rectangular. Like the embodiment, the second electrode EL2 has a first side and a second side which constitute a projected corner where the coupling holes CH are located in the plan view. The recessed parts REC2 have the same planar shape and are arranged in a 2-D matrix along the first side and the second side. The planar shape of the recessed part REC2 is not limited to a rectangular shape but may be elliptic, circular or octagonal.

Also in this modification, the second electrode EL2 electrically floats when the coupling holes CH are formed. Therefore, the same effect as that of the embodiment can be obtained by forming the coupling holes CH in the same manner as in the embodiment.

Modification 2

Figure 17:
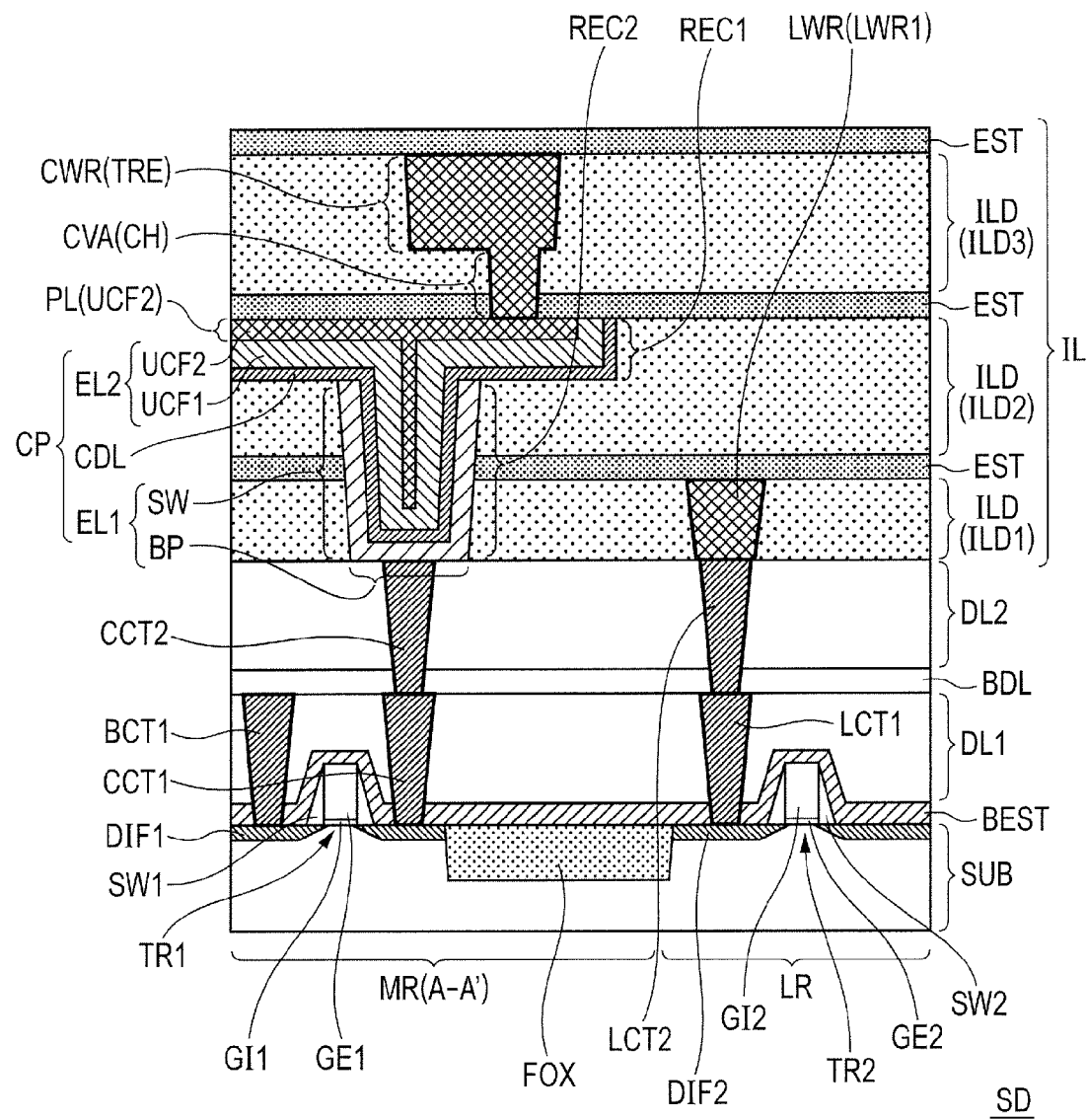
FIG. 17 is a sectional view showing a modification of FIG. 3.

FIG. 17 is a sectional view showing a modification of FIG. 3. This modification is the same as the embodiment except for the shape of the capacitor CP.

Stated more specifically, like the embodiment, the recessed parts REC1 and REC2 are formed in the two interlayer insulating films ILD (interlayer insulating films ILD1 and ILD2) which are the lowest layers of the wiring layer IL. The recessed part REC1 is formed in the interlayer insulating film ILD2. In this case, the bottom of the recessed part REC1 is situated above the under surface of the interlayer insulating film ILD2. In other words, the recessed part REC1 does not penetrate the interlayer insulating film ILD2. The recessed part REC2 is formed in the bottom of the recessed part REC1. The recessed part REC2 penetrates the interlayer insulating film ILD2 and the interlayer insulating film ILD1.

The capacitor CP has a first electrode EL1 (lower electrode), a capacitance insulating film CDL and a second electrode EL2 (upper electrode) like the embodiment. The capacitor CP is formed by using the recessed parts REC1 and REC2.

The first electrode EL1 has a bottom part BP and a side wall part SW like the embodiment. The bottom part BP is formed along the bottom surface of the recessed part REC2. The side wall part SW is formed along the inner side wall of the recessed part REC2. In the example shown in the figure, the upper end of the side wall part SW is aligned with the bottom surface of the recessed part REC1. The upper end of the side wall part SW may be situated below the bottom surface of the recessed part REC1. The first electrode EL1 is formed from the same material (for example, titanium nitride (TiN)) as that of the embodiment.

The capacitance insulating film CDL covers the first electrode EL1 in the recessed part REC2 and the bottom of the recessed part REC1. In the example shown in the figure, the capacitance insulating film CDL is formed along the bottom part BP of the first electrode EL1, the inner wall of the side wall part SW of the first electrode EL1 and the bottom of the recessed part REC1. The capacitance insulating film CDL is formed from the same material (for example, a high-k material such as zirconia ($ZrO_2$)) as that of the embodiment.

The second electrode EL2 is a laminate including a conductive film UCF1 and a conductive film UCF2 which are arranged in this order from the capacitance insulating film CDL side like the embodiment. The second electrode EL2 covers the capacitance insulating film CDL. In the example shown in the figure, the second electrode EL2 is formed along the bottom part BP of the first electrode EL1, the inner wall of the side wall part SW of the first electrode EL1 and the bottom of the recessed part REC1. The conductive film UCF1 is formed from the same material (for example, titanium nitride (TiN)) as that of the embodiment, and the conductive film UCF2 is also formed from the same material (for example, tungsten (W)) as that of the embodiment. The conductive film UCF2 becomes a plate PL in an a region external to the recessed part REC2 in the plan view.

Also in this modification, the second electrode EL2 electrically floats when the coupling holes CH are formed. Therefore, the same effect as that of the embodiment can be obtained by forming the coupling holes CH in the same manner as in the embodiment.

Modification 3

Figure 18:
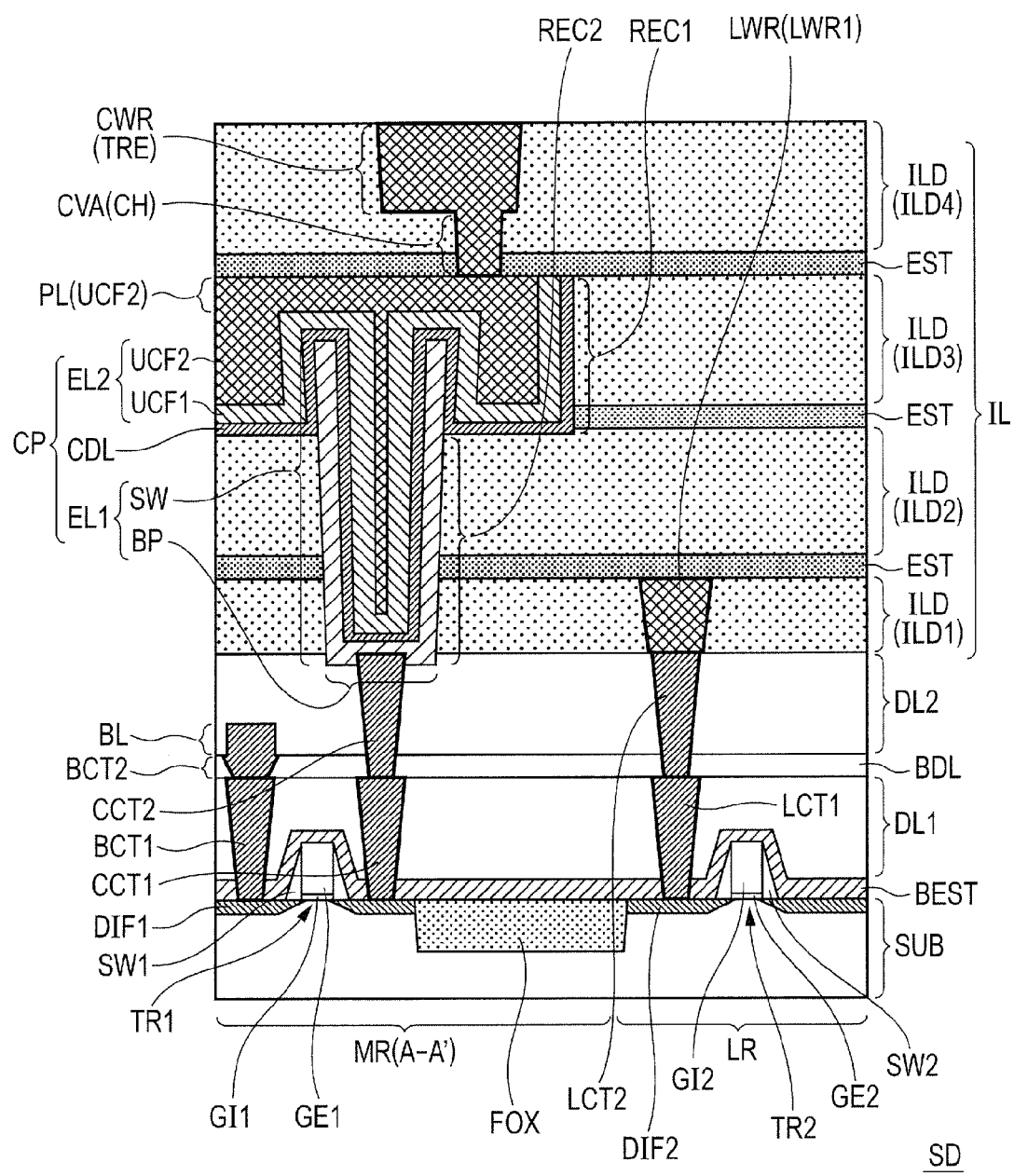
FIG. 18 is a sectional view showing a modification of FIG. 3.

FIG. 18 is a sectional view showing a modification of FIG. 3. This modification is the same as the embodiment except for the shape of the capacitor CP.

Stated more specifically, in the example shown in the figure, the capacitor CP is formed by using the lowermost three layers (interlayer insulating films ILD1, ILD2 and ILD3) of the wiring layer IL. The recessed part REC1 has an opening in the surface of the interlayer insulating film ILD3. The bottom of the recessed part REC1 penetrates the interlayer insulating film ILD3 and enters into the interlayer insulating film ILD2. The recessed part REC2 has an opening in the bottom of the recessed part REC1. The bottom of the recessed part REC2 penetrates the interlayer insulating films ILD2 and ILD1 and enters into the insulating film DL2.

An interlayer insulating film ILD4 is formed above the capacitor CP. A wiring CWR and a via CVA are formed in the interlayer insulating film ILD4. The wiring CWR and the via CVA are formed by using the trench TRE and the coupling hole CH like the embodiment. The via CVA is coupled to the second electrode EL2 (upper electrode) of the capacitor CP.

In this modification, the coupling hole CH is in contact with the second electrode EL2 at a higher position than in the embodiment. Meanwhile, also in this modification, the second electrode EL2 electrically floats when the coupling holes CH are formed. Therefore, the same effect as that of the embodiment can be obtained by forming the coupling holes CH in the same manner as in the embodiment. Thus, the above effect can be obtained likewise regardless of the position of the layer in which the coupling hole CH is in contact with the second electrode EL2.

Modification 4

Figure 19:
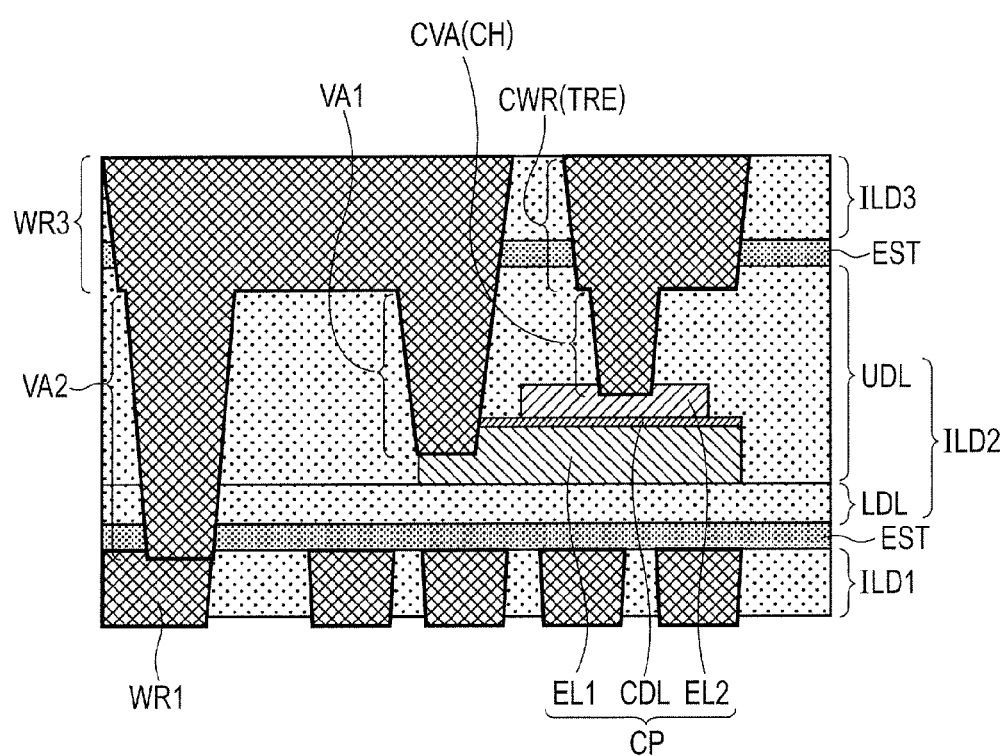
FIG. 19 is a sectional view showing a modification of the capacitor.

FIG. 19 is a sectional view showing a modification of the capacitor CP. This modification is the same as the embodiment except for the following points. In this modification, the first electrode EL1 (lower electrode) and the second electrode EL2 (upper electrode) of the capacitor CP are shaped like a flat plate. The capacitor CP is formed in, for example, the wiring layer IL of the semiconductor device SD shown in FIG. 3. The planar shapes of the first electrode EL1 and the second electrode EL2 are, for example, rectangular. Further, in this modification, the first electrode EL1 includes the second electrode EL2 on the inner side in the plan view.

Stated more specifically, the interlayer insulating film ILD1, the etching stop layer EST, the interlayer insulating film ILD2, the etching stop layer EST and the interlayer insulating film ILD3 are arranged in this order from below. These layers are formed, for example, by using the wiring layer IL as shown in FIG. 3. The interlayer insulating film ILD1 shown in this figure does not need to be formed to the height (the lowest layer of the wiring layer IL) of the interlayer insulating film ILD1 shown in FIG. 3. For example, the interlayer insulating film ILD1 shown in this figure may be at a higher position than the interlayer insulating film ILD1 shown in FIG. 3.

A plurality of wirings WR1 are formed in the interlayer insulating film ILD1. An insulating film LDL is formed over the interlayer insulating film ILD1 through the etching stop layer EST. The capacitor CP is formed over the insulating film LDL. Further, the capacitor CP is covered with an insulating film UDL. The insulating film LDL functions as a layer for securing a distance between the first electrode EL1 (lower electrode of the capacitor CP) and the wirings WR1. In this case, the parasitic formation of the capacitor by the first electrode EL1 (lower electrode) of the capacitor CP and the wirings WR1 is prevented.

An interlayer insulating film ILD3 is formed over the interlayer insulating film ILD2 through the etching stop layer EST. A wiring WR3 and a wiring CWR are formed in the interlayer insulating film ILD3. The wiring WR3 is electrically coupled to the first electrode EL1 (lower electrode of the capacitor CP) through the via VA1 and to the wiring WR1 through the via VA2. Meanwhile, the wiring CWR is electrically coupled to the second electrode EL2 (upper electrode of the capacitor CP) through the via CVA. The wiring CWR and the via CVA are formed by using the trench TRE and the coupling hole CH, respectively, as in the same manner as in the embodiment.

In this modification, like the example shown in FIG. 3, a transistor is formed below the interlayer insulating film ILD1. The wiring WR1 formed in the interlayer insulating film ILD1 is electrically coupled to the source or drain of the above transistor through a conductive member (for example, a via or a wiring). In this case, like the embodiment, the first electrode EL1 (lower electrode of the capacitor CP) is electrically coupled to the above transistor. Further, like the embodiment, the second electrode EL2 (upper electrode of the capacitor CP) electrically floats when the coupling holes CH are formed. Therefore, the same effect as that of the embodiment can be obtained by forming the coupling holes CH in the same manner as in the embodiment.

Figure 20:
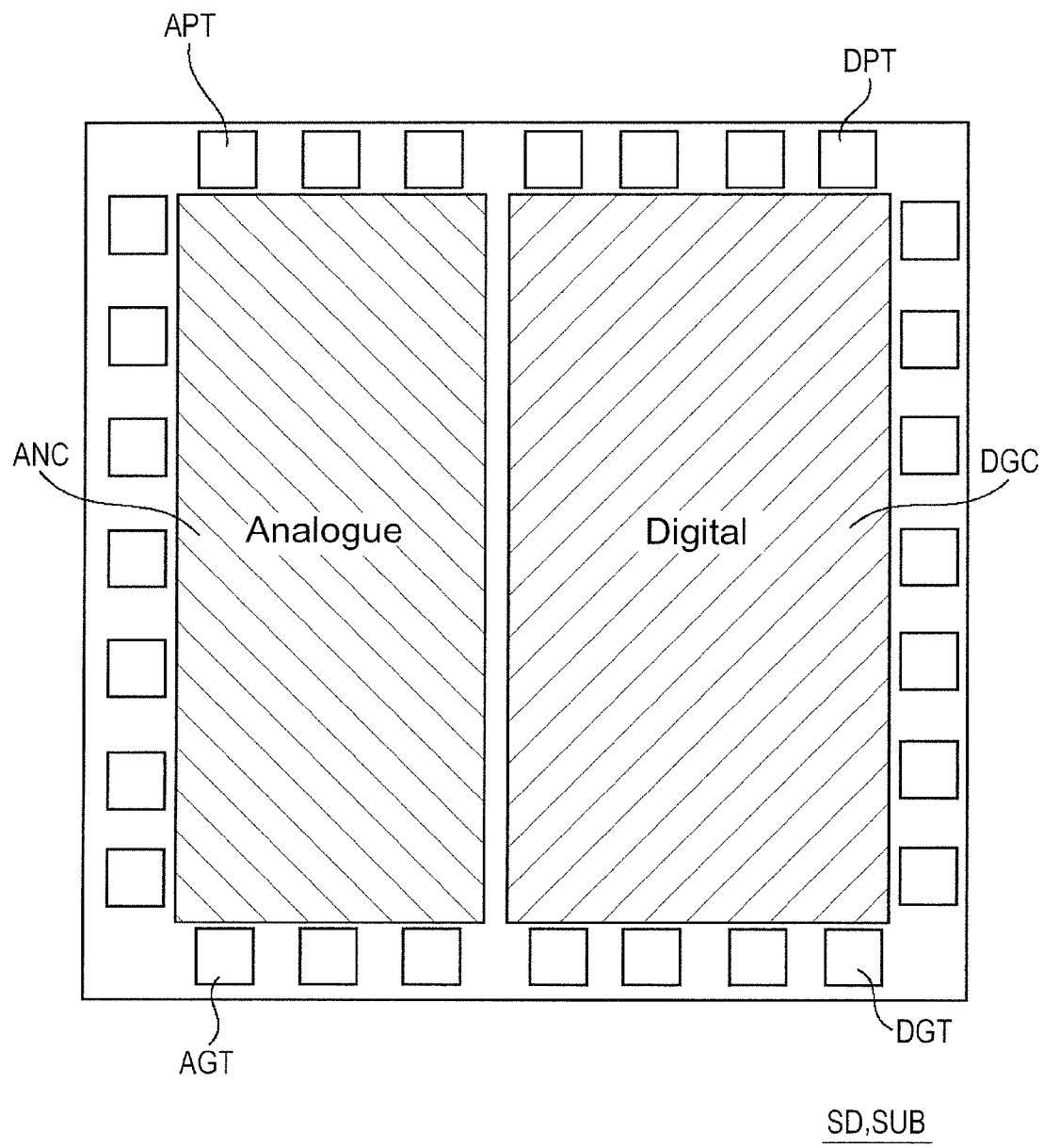
FIG. 20 is a plan view showing the whole semiconductor device shown in FIG. 19.

FIG. 20 is a plan view showing the whole semiconductor device SD shown in FIG. 19. As shown in this figure, the semiconductor device SD has a substrate SUB, an analog circuit ANC and a digital circuit DGC. The analog circuit ANC and the digital circuit DGC are mounted in separate regions in the plan view. The analog circuit ANC is, for example, a high-frequency circuit into which, for example, a 800 MHz or higher frequency signal is input.

In the example shown in this figure, the planar shape of the substrate SUB is rectangular. A plurality of terminals are formed along the margins of the substrate SUB. The analog circuit ANC is electrically coupled to a power supply terminal APT by a wiring (not shown) and to a grounding terminal AGT by another wiring (not shown). Meanwhile, the digital circuit DGC is electrically coupled to an electrode supply terminal DPT by another wiring (not shown) and to a grounding terminal DGT by another wiring (not shown). Thus, power sources for the analog circuit ANC and the digital circuit DGC are separate from each other.

The capacitor CP shown in FIG. 19 constitutes the analog circuit ANC shown in the figure. As the capacitor CP may be used a device having a memory cell and a logic circuit like the embodiment (for example, FIG. 3).

Modification 5

Figure 21:
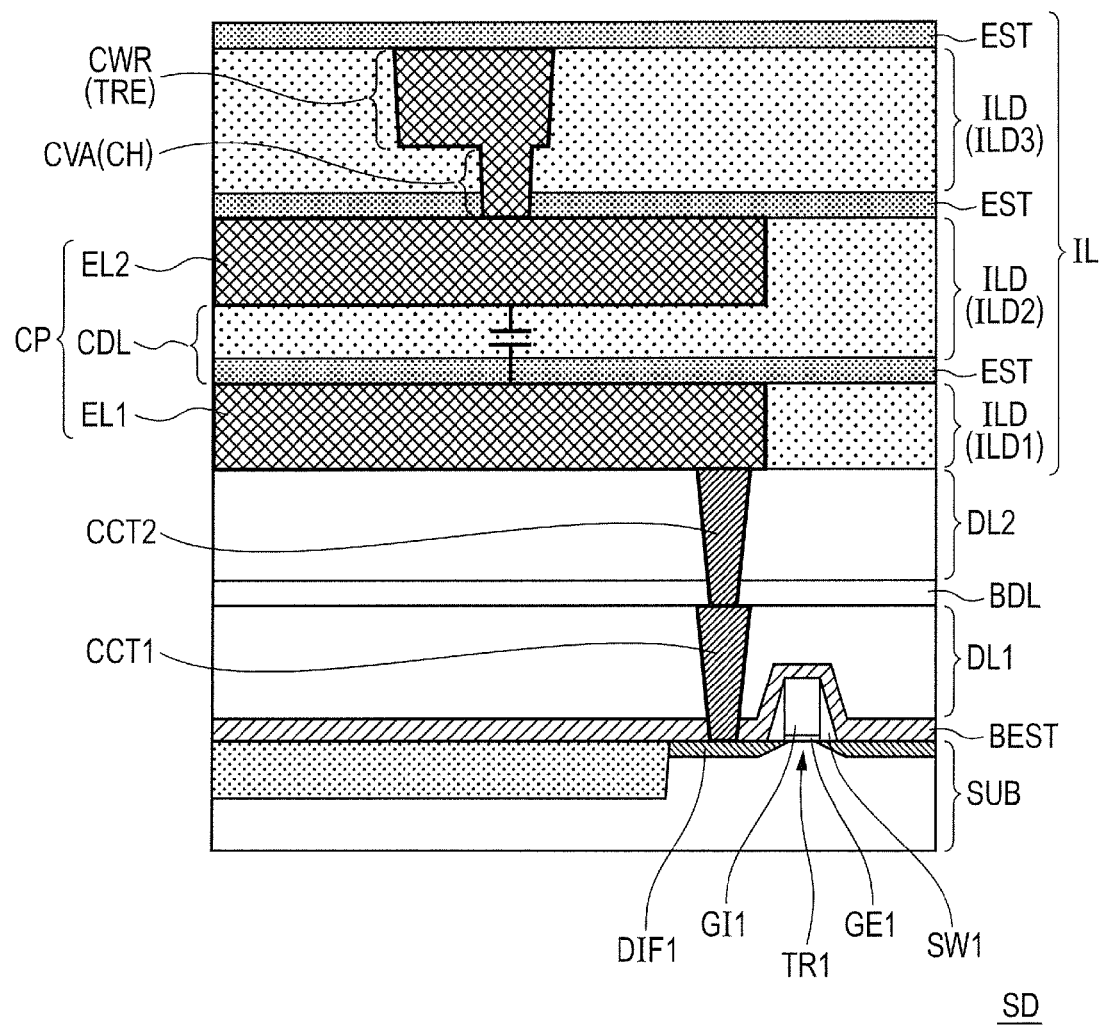
FIG. 21 is a sectional view showing a modification of the capacitor.

FIG. 21 is a sectional view showing a modification of the capacitor CP. This modification is the same as the embodiment except that the capacitor CP uses an interlayer insulating film ILD as the capacitance insulating film CDL. The capacitor of this modification may be used as the analog circuit ANC shown in FIG. 20 like the modification 4.

The capacitor CP is formed by using two interlayer insulating films ILD (interlayer insulating films ILD1 and ILD2) which are the lowest layers of the wiring layer IL. Stated more specifically, the first electrode EL1 (lower electrode of the capacitor CP) is formed in a recessed part having an opening in the surface of the interlayer insulating film ILD1. Meanwhile, the second electrode EL2 (upper electrode of the capacitor CP) is formed in a recessed part having an opening in the surface of the interlayer insulating film ILD2. In this case, the bottom of the second electrode EL2 does not penetrate the interlayer insulating film ILD2. The second electrode EL2 is opposed to the first electrode EL1 through the interlayer insulating film ILD2 below the second electrode EL2. In this case, the interlayer insulating film ILD2 and the etching stop layer EST are situated between the first electrode EL1 and the second electrode EL2. Thereby, the interlayer insulating film ILD2 and the etching stop layer EST function as the capacitance insulating film CDL of the capacitor CP.

The interlayer insulating films ILD in which the capacitor CP is formed are not limited to the examples shown in this figure. For example, the capacitor CP may be formed by using an interlayer insulating films ILD above the interlayer insulating films ILD1 and ILD2.

In the example shown in this figure, the first electrode EL1 (lower electrode of the capacitor CP) is electrically coupled to the diffuse layer DIF1 (source or drain) of the transistor TR1 through the contacts CCT1 and CCT2 like the embodiment. Meanwhile, the second electrode EL2 (upper electrode of the capacitor CP) is electrically coupled to the wiring CWR and the via CVA formed in the interlayer insulating film ILD (interlayer insulating film ILD3) above the second electrode EL2 like the embodiment. The wiring CWR and the via CVA are formed by using the trench TRE and the coupling hole CH like the embodiment.

Also in this modification, the second electrode EL2 electrically floats when the coupling holes CH are formed. Therefore, the same effect as that of the embodiment can be obtained by forming the coupling holes CH in the same manner as in the embodiment.

Modification 6

Figure 22:
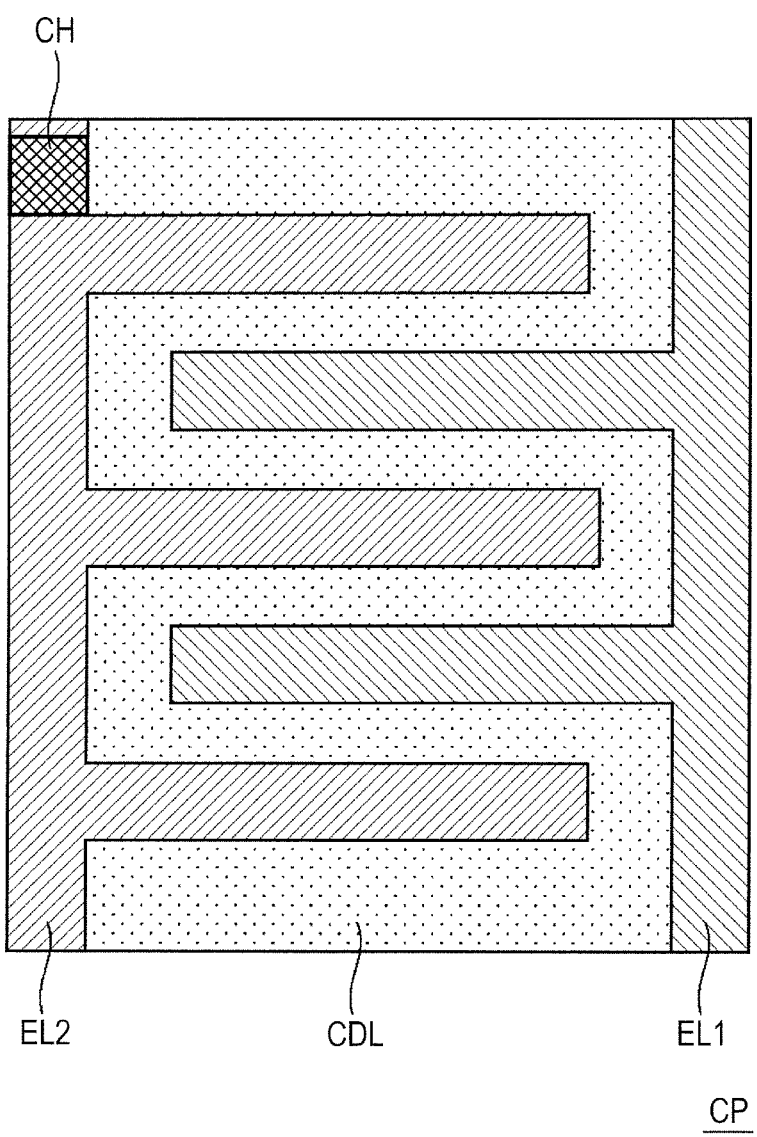
FIG. 22 is a plan view showing a modification of the capacitor.

FIG. 22 is a plan view showing a modification of the capacitor CP. This modification is the same as the embodiment except for the shape of the capacitor CP. Stated more specifically, the capacitor CP has a first electrode EL1 and a second electrode EL2. The first electrode EL1 and the second electrode EL2 are formed alternately in a comb-like form. The capacitance insulating film CDL is situated between the first electrode EL1 and the second electrode EL2. The first electrode EL1 is electrically coupled to a transistor (not shown in the figure) like the embodiment. Meanwhile, the coupling hole CH is formed on the second electrode EL2 like the embodiment. The lower end of the coupling hole CH is in contact with the second electrode EL2.

The capacitor CP of this modification is formed, for example, by using the wiring layer IL shown in FIG. 3. For example, the first electrode EL1 and the second electrode EL2 are formed in the interlayer insulating film ILD (one layer in the wiring layer IL) by patterning. In this case, a portion situated between the first electrode EL1 and the second electrode EL2 of the above interlayer insulating film ILD functions as the capacitance insulating film CDL.

Also in this modification, the second electrode EL2 electrically floats when the coupling holes CH are formed. Therefore, the same effect as that of the embodiment can be obtained by forming the coupling holes CH in the same manner as in the embodiment. The capacitor CP of this modification may be used as the analog circuit ANC shown in FIG. 20 like the modification 4.

While the invention made by the inventors of the present invention has been described with reference to a preferred embodiment thereof, it is needless to say that it is not limited to the embodiment and that various changes and modifications may be made in the invention without departing from the spirit and scope thereof.

What is claimed is:

1. A semiconductor device comprising:
   a substrate;
   a transistor which is formed over the substrate;
   a capacitor which is electrically coupled to the transistor and includes a first electrode electrically coupled to the transistor, a second electrode separate from the first electrode, and a capacitance insulating film situated between the first electrode and the second electrode;
   an insulating cover film which covers the second electrode;
   a plurality of coupling holes which are formed in the insulating cover film and whose lower ends are each in contact with the second electrode; and
   vias which are embedded in the coupling holes,
   wherein, when the capacitance of the second electrode is represented by C [nF] and the total area of the lower ends of the coupling holes is represented by A [$\mu m^2$], the following expression (1) is satisfied $$C/A \leq 1.98 \, [nF/\mu m^2]. \tag{1}$$

2. The semiconductor device according to claim 1, wherein the second electrode is formed from a metal having an electric resistivity at 25° C. of 1.68 to 28.00 $\mu\Omega\cdot cm$.

3. The semiconductor device according to claim 2, wherein the metal is tungsten.

4. The semiconductor device according to claim 2, wherein the metal is copper.

5. The semiconductor device according to claim 1 further comprising interlayer insulating films over the substrate, wherein the capacitor is formed by using recessed parts formed in the interlayer insulating films.

6. The semiconductor device according to claim 5, the width of the upper end of each of the coupling holes is 45 nm or less.

* * * * *